US006353258B1

(12) United States Patent
Inoue et al.

(10) Patent No.: US 6,353,258 B1
(45) Date of Patent: Mar. 5, 2002

(54) SEMICONDUCTOR MODULE

(75) Inventors: Hirokazu Inoue, Tokai-mura; Ryuichi Saito, Hitachi; Mutsuhiro Mori, Mito; Yasutoshi Kurihara, Hitachinaka; Jin Onuki, Hitachi; Shin Kimura, Hitachi; Satoshi Shimada, Hitachi; Kazuhiro Suzuki, Mito; Yukio Kamita, Hitachi; Isao Kobayashi, Naka-machi; Kazuji Yamada; Naohiro Momma, both of Hitachi, all of (JP)

(73) Assignees: Hitachi, Ltd., Tokyo; Hitachi Car Engineering Co., Ltd., Ibaraki, both of (JP)

( * ) Notice: Subject to any disclaimer, the term of this patent is extended or adjusted under 35 U.S.C. 154(b) by 0 days.

(21) Appl. No.: 09/603,966

(22) Filed: Jun. 26, 2000

Related U.S. Application Data

(63) Continuation of application No. 09/089,065, filed on Jun. 2, 1998, which is a continuation of application No. 08/587,532, filed on Jan. 17, 1996, now abandoned.

(30) Foreign Application Priority Data

Jan. 17, 1995 (JP) .................................................. 7-4669

(51) Int. Cl.⁷ .............................................. H01L 23/34
(52) U.S. Cl. ...................................... 257/723; 257/690
(58) Field of Search ................................ 257/690, 691, 257/692, 724, 788, 723

(56) References Cited

U.S. PATENT DOCUMENTS

| | | | |
|---|---|---|---|
| 3,893,159 A | 7/1975 | Martin | 357/70 |
| 4,578,697 A | 3/1986 | Takemae | 357/75 |
| 4,589,195 A | 5/1986 | Dubois et al. | 29/588 |
| 4,988,034 A | 1/1991 | Taniguchi et al. | 228/122 |
| 5,306,949 A | 4/1994 | Yamada et al. | 257/690 |
| 5,324,888 A | 6/1994 | Tyler et al. | 174/52.2 |

FOREIGN PATENT DOCUMENTS

| | | |
|---|---|---|
| DE | 4316639 | 1/1994 |
| EP | 0629464 | 12/1994 |

OTHER PUBLICATIONS

Electronic Packaging and Interconnect Handbook C.A. Harper Ed McGraw–Hill, pp. 5.5, 6.18 Date: 1991.
Patent Abstracts of Japan, Pub. No. 03–097257, published Mar. 23, 1991, entitled "Large Power Semiconductor Device".
Patent Abstract of Japan, Pub. No. 03–292764, published Dec. 24, 1991, entitled "Transistor Module & Inverter Device".
Patent Abstracts of Japan, Pub. No. 61–185954, published Aug. 19, 1986, entitled "Resin–sealed Power Semiconductor Device".
Patent Abstracts of Japan, Pub. No. 04–350957, published Dec. 04, 1992, entitled "Power Semiconductor Module".
Patent Abstracts of Japan, Pub. No. 05–013920, published Jan. 22, 1993, entitled "Manufacture of Ceramic Circuit Substrate".

*Primary Examiner*—Douglas A. Wille
(74) *Attorney, Agent, or Firm*—Antonelli, Terry, Stout & Kraus, LLP

(57) ABSTRACT

A semiconductor module has a plurality of power semiconductor devices mounted on a substrate, and a metal foil for wiring is mounted on the substrate so that an asymmetric unit arrangement of the semiconductor devices is formed. In the device, all of the units are arranged in the same direction on the substrate, and all of the units are electrically connected with electrode terminal feet, and the electrode terminal feet are electrically connected with linkage terminal foot. The electrode terminal feet are disposed with a certain interval.

44 Claims, 19 Drawing Sheets

SECTIONAL VIEW A-A'

SECTIONAL VIEW A-A'

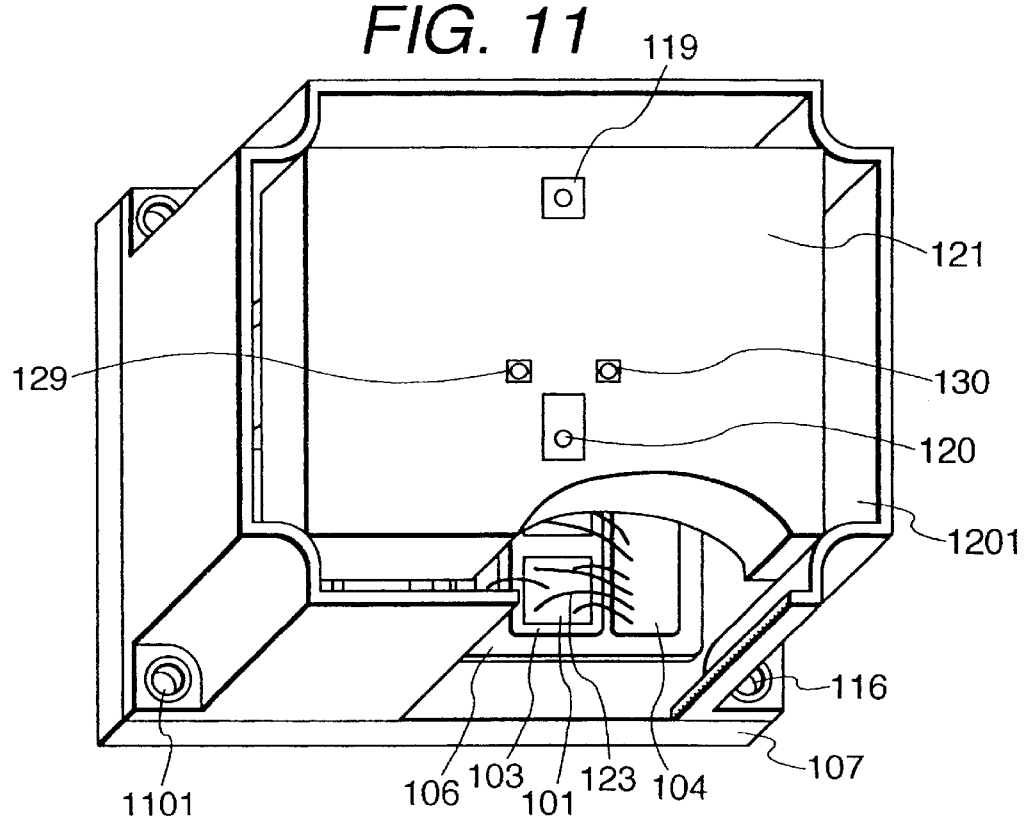
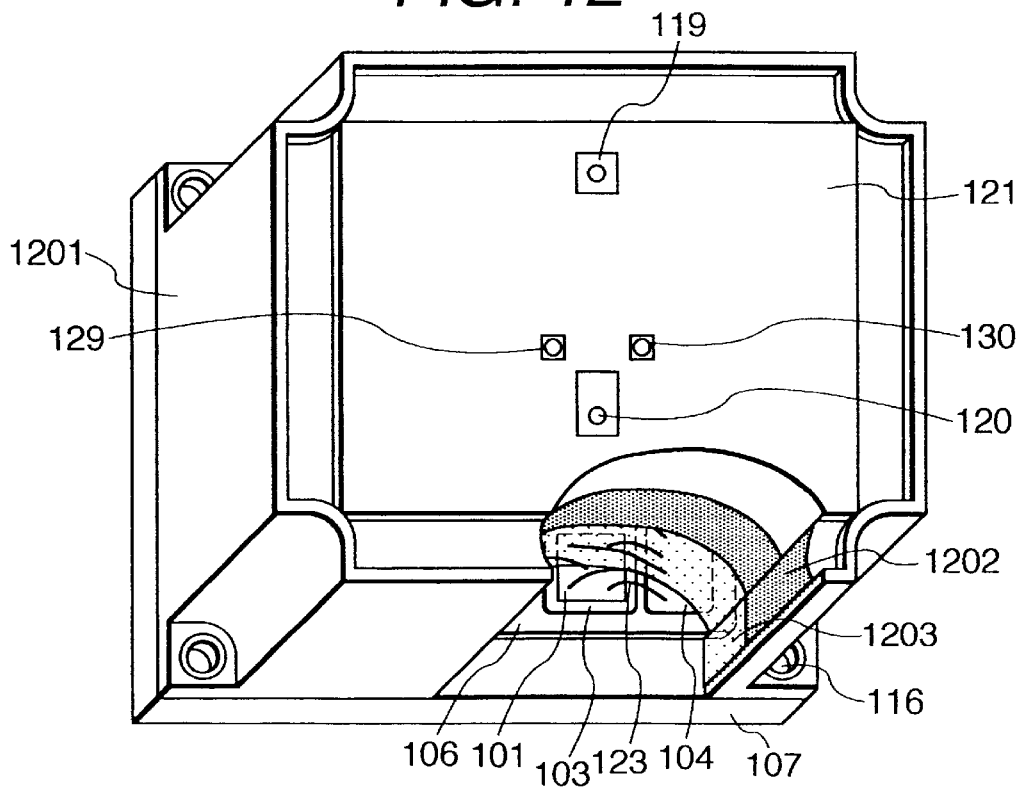

SECTIONAL VIEW A-A'

SECTIONAL VIEW A-A'

SEMICONDUCTOR MODULE

CROSS REFERENCE TO RELATED APPLICATION

This application is a continuation of application Ser. No. 09/089,065 filed Jun. 2, 1998, which, in turn, is a continuation of Ser. No. 08/587,532, filed on Jan. 17, 1996, now abandoned.

BACKGROUND OF THE INVENTION

This invention relates to a semiconductor module having a plurality of structural units each of which has a plurality of power semiconductor elements such as chips of insulated gate transistors and diode chips, etc.

As is explained in "Journal of Electronic Engineering", (August, 1991) pp. 17 to 71, for example, an insulated gate transistor is an electric power switching element having the high-speed and high input impedance characteristics of a MOSFET and the low saturation voltage characteristics of a bipolar transistor. The insulated gate transistor has the following features.

(1) Voltage driving type
(2) A high-speed operation

The insulated gate transistor is easy to use and provides a high performance, thus the insulated gate transistor has been used as an electric power switching element.

On the other hand, the insulated gate transistor has the following problems:

(a) It is difficult to make a device able to withstand high voltage; and
(b) Small electric current capacity per unit area of the chip.

When switching a large amount of electric power, series and parallel connections of chips are indispensable to solve the problems mentioned above. Therefore, modules of insulated gate transistors and multiplex connection of modules have been employed. When the modules of the insulated gate transistors are prepared, they must be connected in series.

One unit circuit is formed in a module. The number of units is increased or decreased in a module, according to demands. Two parallel connections of the unit circuits in one module are generally employed, which is disclosed in Japanese Patent Laid-open Publication No. 2-178969, for example. In this publication, each unit of two parallel connections is arranged in line symmetry in the module. However, such an arrangement is difficult to adapt to a multiplex parallel connection, such as three or four parallel connections.

As mentioned above, a single insulated gate transistor module has sometimes an insufficient withstanding capacity to voltage and current. In this case, multiplex connections of the modules are necessary, as well as multiplex connections of the units in one module. In order to solve the above problems, a structure has been desired in which connecting terminals are concentrated on the upper surface of the module. In addition, it is required that the gate wiring be resistive to the influence of the main circuit wiring among modules. An influence on the gate wiring by the electric current flowing in the main circuit is greatly affected by arrangement of the gate terminal of the module. For example, a structure for connecting terminals arranged on the upper surface is disclosed in Japanese Patent Laid-open Publication No. 57-15453. In this case, a base is arranged at the end of the module, considering a parallel connection of the modules. In this arrangement, the base is used instead of a gate because the arrangement is related to a transistor module. When the modules of this structure are connected in series, the wiring of the main circuit is formed above the base terminal. Thus, the base circuit is influenced by the current flowing in the main circuit, which is not convenient for the device.

As was described in the above-mentioned publication, consideration has not been paid to a unit in the module having a structure which can provide a multiplex connection of the units even if the number of structural units exceeds two or a structure which can avoid the problems stemming from multiplex connection of the module.

SUMMARY OF THE INVENTION

An object of this invention is to provide a power electric semiconductor module, which mounts power semiconductor elements such as insulated gate transistors, diodes, etc. and which is capable of expanding the capacity of a module in accordance with demands.

Another object of this invention is to provide a power electric semiconductor module with high reliability, which mounts power semiconductor elements, such as insulated gate transistors, diodes, etc.

According to this invention, a multiplex connection in the module is realized by a method in which a plurality of structural units having the same configuration are arranged in the same direction on a substrate, each of the structural units comprising power semiconductor elements and wiring metallic foil, the elements and foils being arranged asymmetrically on the substrate, wherein an electrode terminal is arranged with certain spacing with adjoining electrode terminals above each of the structural units, and these terminals are connected with linkage terminals.

According to an example of this invention, all of the main terminals and auxiliary terminals are arranged on the top surface of the module to form a multiplex connection in a module. It is desirable that auxiliary terminals are arranged between the main terminals. According to another example of this invention, a tin and antimony solder is used for bonding the power semiconductor elements so as to increase the reliability of the module. At the same time, a tin and lead solder is used for bonding the members for supporting the power semiconductor elements in the module to secure the reliability of the module.

According to still another example of the present invention, the reliability of the module is increased by providing an air layer in the module to avoid excessive stress due to expansion and shrinkage of silicone gel.

BRIEF DESCRIPTION OF THE DRAWINGS

FIG. 11 is another perspective view showing the first example of the present invention.

FIG. 12 is still another perspective view showing the first example of the present invention.

DETAILED DESCRIPTION OF THE PREFERRED EMBODIMENTS (1) Multiplex Connection in the Module The basic feature of this invention resides in a structure that can gain necessary and sufficient electric performance in the case where the number of parallel connections of a unit is two in the module. At the same time, in case of three or more parallel connections, the structure also can gain necessary and sufficient electric performance. In case of controlling a large electric current, it is important for any difference in inductance of a parallel circuit to be controlled so as to be as small as possible.

When an inductance between parallel circuits is inconsistent, counter electromotive forces, which occur due to an inductance component at the time of switching, become irregular. Therefore, there arises an inconvenience in that the electric current concentrates in some circuits. It is important to form an arrangement wherein the length of the wiring of the parallel connections to the internal unit is the same.

In a parallel connection for two units, the wiring length can be made equal, in the case of symmetrically arranging a power semiconductor element and wiring on line. Consequently, the inductance of all circuits can easily be controlled to be the same. But, it is difficult for three units to be connected in parallel with one another. The arrangement of a structural unit of this invention can be applied to a parallel connection of three units or more in the same manner as the parallel connection of two units.

Figure 3A:
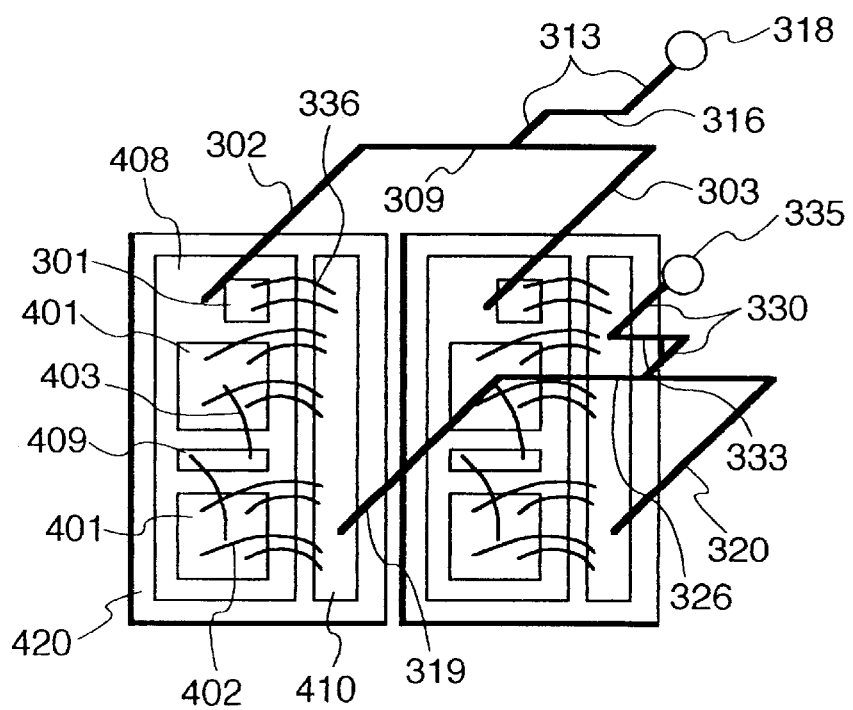
FIGS. 3a and 3b show plane schematic diagrams of the first example of this invention.
Figure 3B:
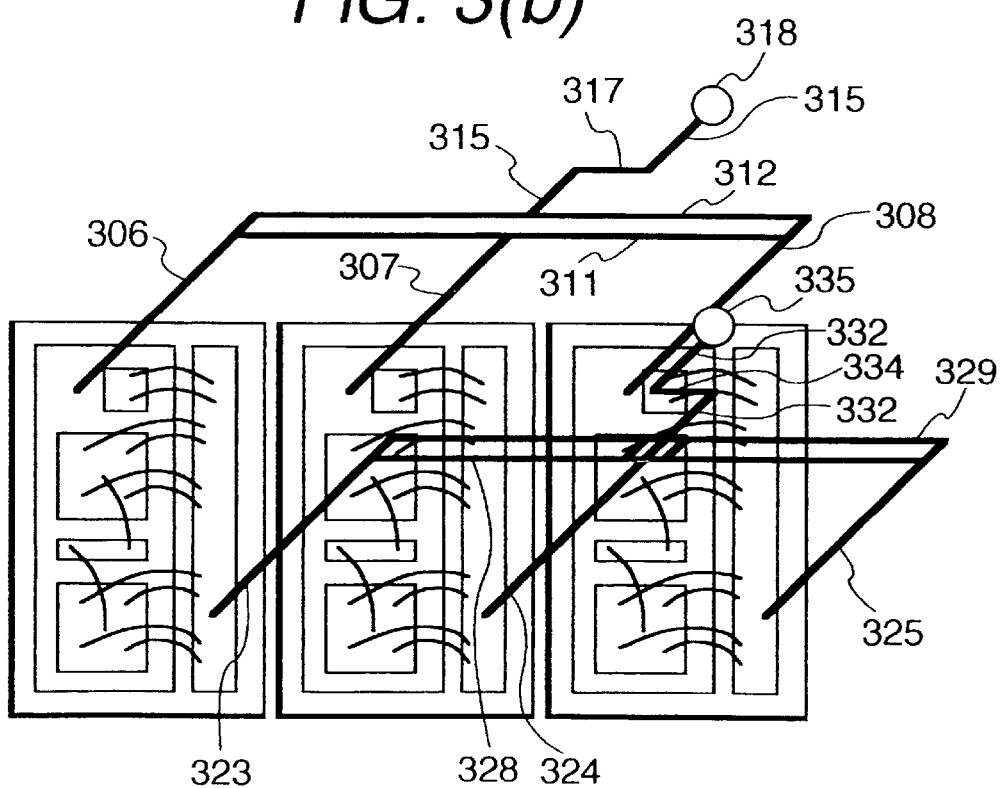

In FIGS. 3a and 3b, there are shown the arrangement examples of a structural unit of the present invention. The structural unit comprises two chips of insulated gate transistors 401, a chip of diode 301 and wiring copper foils 408, 409, 410 mounted on an aluminum nitride substrate 420. An internal wiring is formed with aluminum wire for emitter wire 402, gate wire 403 and anode wire 336.

In the arrangement of this invention as shown in FIG. 3a and FIG. 3b, the same kind of structural units are arranged in substantially the same direction. The plural structural units comprising plural power semiconductor elements and metal foil for wiring on a substrate are placed in substantially the same direction, wherein the elements and foils are asymmetrically arranged. By this arrangement, parallel connections of three structural units can be easily achieved, as shown in FIG. 3b. Since the power semiconductor elements have varied electrical characteristics more or less from each other as have the other semiconductor elements, the structural units have varied characteristics from each other. Use of structural units of the same pattern like the present invention facilitates a combination of structural unit of close characteristics.

According to this invention, the positions of soldering terminal feet and of taking out electric current from each of the structural units are the same. The pitch between terminal feet that are connected in parallel becomes the same as the pitch of the structural units; therefore, an adjustment of the balance of inductance is easy. Thus, intervals between collector terminal feet between 306 and 307, and collector feet between 307 and 308, and emitter terminal feet between 323 and 324 and between 324 and 325 are the same. Accordingly, at least the structural units of both ends have the same inductance in the paths from a contacting point between collector joining terminal foot 315 and collector inductance adjustment terminal foot 312 until another contacting point between emitter joining terminal foot 332 and emitter inductance adjustment terminal foot 329 through each of the structural units. If the inductance to the central structural unit is adjusted to cope with the inductance to the structural units of both ends, all inductance to the three structural units will be the same.

In an example of FIG. 3b, the collector inductance adjustment terminal foot 312 and the emitter inductance adjustment terminal foot 329 are provided in order to adjust the inductance to a central structural unit from both ends. Because the collector linkage terminal foot 311 and the collector inductance adjustment terminal foot 312 are close to each other, a mutual inductance occurs between these terminal feet. By an adjustment of both the intervals and the approaching length between them, the inductance of a route to a central structural unit can be adjusted to those of the two structural units of both ends. Likewise, it is possible to make the parallel connections of four or more as well as series connections.

(2) Multiplex Connection Outside the Module

In the module of the present invention, all external terminals are arranged on the top surface of the module, and gate terminals for driving gates and auxiliary emitter terminals are arranged between a collector terminal and an emitter terminal. This structure has good electric characteristics and good usability.

Figure 2:
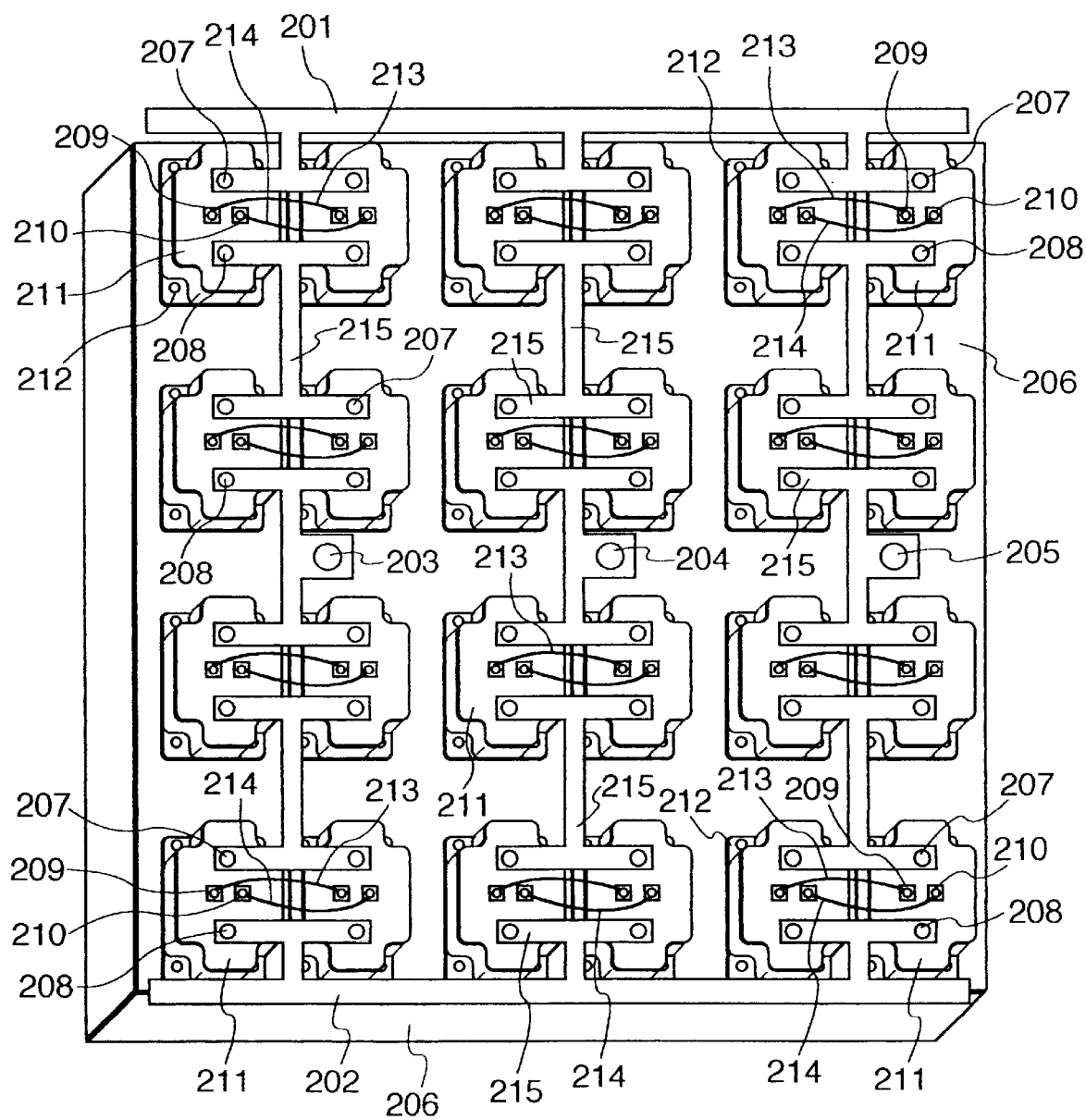
FIG. 2 shows a perspective view of the first example of this invention.

FIG. 2 shows an example of multiplex connection of a module of this invention. FIG. 2 is an example of a semiconductor module having insulated gate transistors, which was applied to an inverter for generating three phase alternating current from a direct current power source. The direct current power source is connected to direct current plus-input 201 and direct current minus-input 202. A three-phase alternating current is output from U phase 203, V phase 204 and W phase 205.

In the inverter shown in FIG. 2, two modules are connected in parallel because the electric current capacity of a single module is too small. In each module, collector terminal 207, emitter terminal 208, gate terminal 209, auxiliary emitter terminal 210 and all external terminals are mounted on the top surface of resin case 211.

Collector terminal 207 and emitter terminal 208 on resin case 211 are located on almost the center line of the top surface of the module, and gate terminal 209 and auxiliary emitter terminal 210 are provided between these main terminals, i.e. collector terminal 207 and emitter terminal 208. Therefore, board wiring 215 does not overlap with gate wiring 213 for driving the gate and auxiliary emitter wiring 214. In this arrangement, the circuit through which the main electric current flows and the gate circuit that supplies the control voltage are separated thus there are such advantages that an assembly of the module is easy, and interference by the main electric current to the gate circuit is little.

The influence due to unbalance of an electric current in a circuit part for a small electric current is smaller than in a circuit part for a large electric current. If the module of this invention is used, three parallel connections of units are realized in one module; and a module having two parallel connections with good electric current balance can be realized. This structure absorbs any unbalance of an electric current in the module thus the balance of the whole system becomes better.

As mentioned above, three parallel connections of units in the module are realized, and it is possible to design a flexible system which is easy to take balance as a total system.

(3) Highly Reliable Bonding Structure

According to the structure in the module of this invention, a solder material whose main components are tin (Sn) and antimony (Sb) is used for places where the power semiconductor elements are bonded to a substrate. This solder contains a high quantity of tin and is a relatively hard material. The thermal fatigue resistance of the bonding points is improved by using this solder material beneath the silicon chip.

As the solder is hard, the distortion by thermal fatigue will hardly influence the solder. According to our knowledge, when the content of antimony ranges from 4 to 6% by weight, a good soldering property and reliability of bonding points are obtained. When a highly reactive solder material containing 90% by weight of Sn or more is used, a metallized layer on the back face of the silicon chip tends to be corroded.

Figure 4:
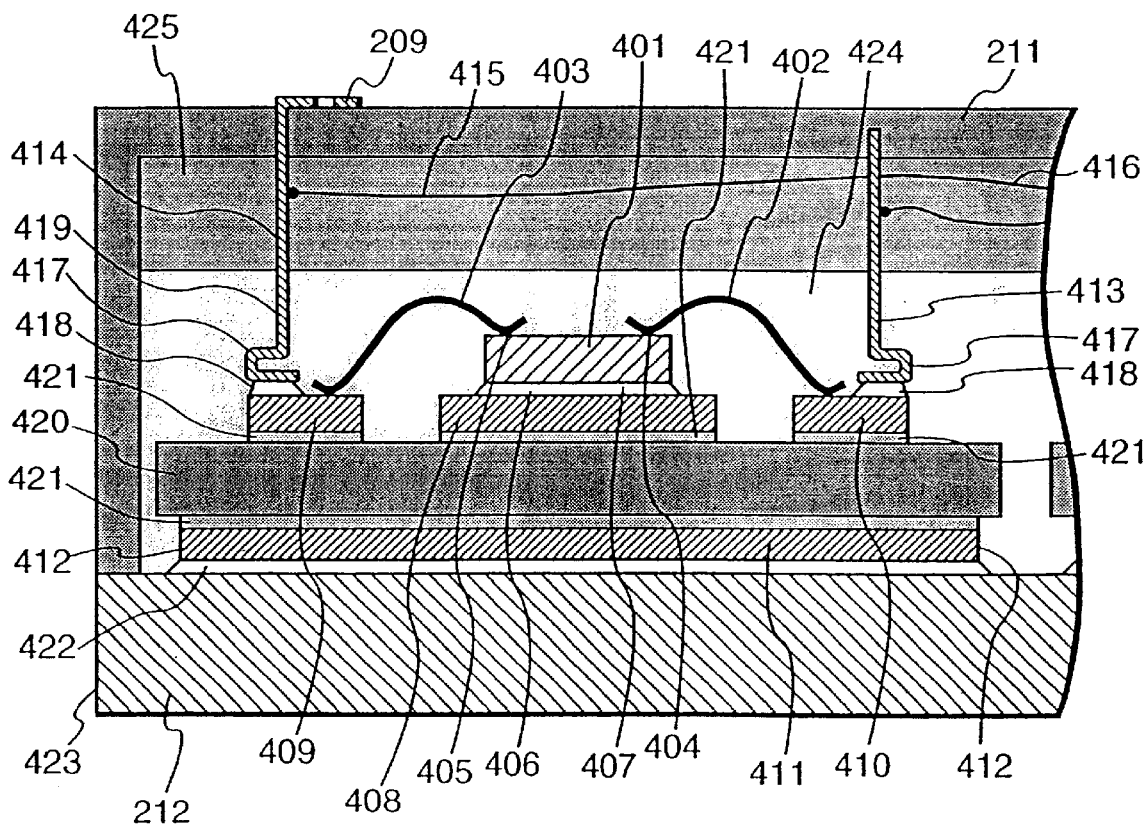
FIG. 4 shows a cross sectional view of the first example of this invention.

Collector wiring copper foils beneath the chips with which the solder material is in contact are plated with nickel plating thereby to prevent corrosion of the copper foils due to the solder material. An example of the structure in the module is shown in FIG. 4, which shows a part of the cross section of the standard module of this invention. The external wall of the module is composed of metal plate 212 covered with nickel plating 423 and resin case 211.

Insulated gate transistor chip 401 is bonded by solder 406 which is beneath the chip, on copper foil 408 for collector wiring bonded to the surface of aluminum nitride substrate 420 with silver solder 421. Aluminum pad 405 for connecting gates of the insulated gate transistor 401 and copper foil 409 for wiring gates of the insulated gate transistor chip 401 are connected with gate wire 403. Aluminum pad 404 for connecting emitters and copper foil 410 for wiring emitters are connected with emitter wire 402. These wires are connected to gate terminal 209, emitter terminals (not illustrated) and auxiliary emitter terminals (not illustrated). The main terminals (i.e. terminals in which the main electric current flows) are not illustrated in the figure. All wiring of the main terminals in the module are made in the terminal feet.

On the other hand, the gate wiring and the auxiliary emitter wiring are ones with the terminal feet and the stranded wire covered with insulating material. The structural units are connected with gate connecting wire 415 and auxiliary emitter connecting wire 416. The terminals extending to the outside of the module are gate terminal 209 and an auxiliary emitter terminal (not illustrated). A stranded wire coated with a fluorine containing resin is used as a connecting wire of the gate and auxiliary emitter. Insulated gate transistor chip 401 is covered with silicone gel 424 to protect it from water that comes into the module through resin case 211 and leads to deterioration of the electric characteristics.

Epoxy resin 425 having good adhesive property with resin case 211 is filled between silicone gel 424 and resin case 211 in order to lower the penetrating speed of water. As the terminal foot, there is used a copper material coated with nickel plating 419 on the surface of copper which was softened by heat treatment in advance. The thermal expansion coefficients of the resin case 211, the epoxy resin 425 and the silicone gel 424 are larger than that of any metals. Because the silicone gel exhibits an expansion coefficient equivalent to that of liquid, a large distortion is imparted to the gate terminal foot 414 for the external terminal connection and auxiliary emitter terminal foot 413 for the internal connection in response to changes in the ambient temperature. Then, too much thermal stress on solder 418 at the tips of terminal feet is prevented by providing the terminal feet in the vicinity of solder 418 at the tips thereof with bended portions 417. This countermeasure may be applied to the main terminals, though this is not illustrated. When the outer wiring is screwed to the outer terminals feet, the screwing force is also imparted to the terminal feet.

Bended portions 417 of the terminal feet have a function that the influence of an external stress is not directly applied to tip solder 418 of the terminal feet. In addition, the solder material of tin and lead series is used for bonding portions of the members for supporting the power semiconductor elements.

The following is a description regarding other bonding portions of the semiconductor module of this invention, i. e. portions between copper foil 411 and metal plate 212 for bonding the back face of the aluminum nitride substrate 420. A feature of the bonding portions of solder 422 for fixing the aluminum nitride substrate is that it has a large bonding area. Accordingly, the solder should have a good wettability and little void-forming. The above mentioned tin-antimony based solder does not have good wettability, thus the tin-antimony base solder is not suitable for bonding these portions. The solder for bonding of these portions should be soft. In a layer structure, as shown in FIG. 4, insulated gate transistor chip 401 and metal plate 212 are as hard as solder 406 beneath the chip, and so there is no soft place except for the bonding portions between copper foil 411 and metal plate 212 for the back face of the aluminum nitride substrate.

The module shown in FIG. 4 is a structure that has a relatively small heat stress, but tends to have increased heat distortion. Accordingly, a soft solder material such as solder 422 for bonding the aluminum nitride substrate should be used in order to alleviate thermal stress. For the above two requisites, a tin and lead based solder, which has good thermal resistance, was adopted to satisfy wettability and softness for a large bonding area. The solder of this composition is sufficiently soft and has about half the value of Young's modules, compared with tin-antimony base solder, even if the solder has a composition of Sn—Pb near the eutectic point and is relatively hard. Accordingly, the soft solder can sufficiently function as a stress absorption layer in the whole layer structure shown in FIG. 4. Moreover, the solder material of the composition has a good wettability.

There may be no any other adequate solder material for soldering the portions. Concretely, bonding of the portions by the use of the Sn—Pb solder material is carried out after bonding using Sn—Sb solder material, and a solder material having a composition close to the eutectic point and a low melting point is used.

(4) Highly Reliable Module Structure

Figure 5:
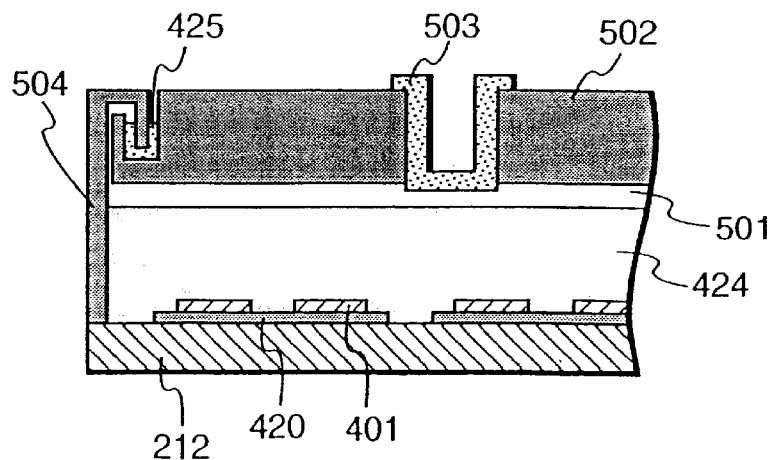
FIG. 5 shows a cross sectional view of a second example of this invention.

The module of this invention has an air layer in the module. It is possible to prevent excessive stress due to thermal expansion and shrinkage of the silicone gel in the module. The structural example of the inside of the module is shown in FIG. 5. Descriptions directly related to solder materials, bonding wire and terminal feet, etc. are omitted for simplification. In FIG. 5, the resin lid 502 also operates to fix the terminal feet. Resin lid 502 is fixed to the terminal feet at the time of soldering them. Resin wall 504 is adhered to metal plate 212. Epoxy resin 425 is injected into a part where the resin lid 502 engages with the resin wall 504, and is hardened thereafter.

Silicone resin was injected into a hole in the resin lid 502, and hardened to be silicone gel 424. The injected quantity of the silicone resin is adjusted so that the air layer 501 remains on the upper position, and a silicone rubber cap 503 is pressed thereinto. Because the silicone gel has a large thermal expansion coefficient, such as the several hundreds ppm per ° C., the reliability of the package is improved by suppressing the pressure change in the package due to the expansion and shrinkage.

Gases generated in curing the silicone resin when the inner surface is coated with the silicone resin lowers the bonding strength between the case material and the epoxy resin so that the reliability of the package decreases. This structure solves these problems.

As for expansion of the silicone gel, a sufficient buffer effect is gained by providing the air layer in the package. With regard to contamination of the inner surface of the case due to gases generated in hardening the silicone resin, it is possible to avoid it by hardening the epoxy resin before hardening the silicone resin. As is apparent from the foregoing, the structure has a space above the silicone gel while securing good bonding between the epoxy resin, and the package has high reliability. Examples of this invention are explained in detail as follows. The scope of the present invention should not be limited by these examples. Examples 1 through 7 will be explained by reference to FIG. 1, FIG. 2 and FIG. 4 through FIG. 29.

EXAMPLE 1

The first example of this invention will be explained with reference to FIG. 1, FIG. 2, FIG. 4 and FIG. 7 through FIG. 13.

FIG. 12 is a perspective view of the first example of this invention. A molybdenum plate was used as a heat sink metal plate for mounting the module (not illustrated). Molybdenum substrate 107 is plated with nickel (not illustrated) for the purpose of soldering and improving moisture resistance. The side wall and the upper part of the module were composed of resin. The main terminals and the auxiliary terminals were arranged on the top surface of the module.

Collector terminal 119 and emitter terminal 120, representing the main terminals, were arranged on the center line of the module. Gate terminal 129 and auxiliary emitter terminal 130, representing auxiliary terminals, were arranged between the main terminals. The four corners of case wall 1201 were scooped out in an circular arc, and were provided with installing holes 116 thereby to keep the external dimension small and to secure the internal dimension.

FIG. 12 is a partially cutaway view so that the inside of the module can be seen. Silicone gel 1203 and epoxy resin 1202 are filled in lamellar form in the interior of the module. Silicone gel 1203 covers insulated gate transistor chip 101, and epoxy resin 1202 covers the silicone gel. Because the semiconductor module of this invention deals with a large electric current, it is necessary to prevent as much as possible the factors that generate mutual interference with wiring outside of the module. Terminals that may cause unnecessary electromagnetic induction should not be exposed outside the module. Thus, the wiring between structural units is provided in the semiconductor module as well as wiring in the structural unit.

Figure 10A:
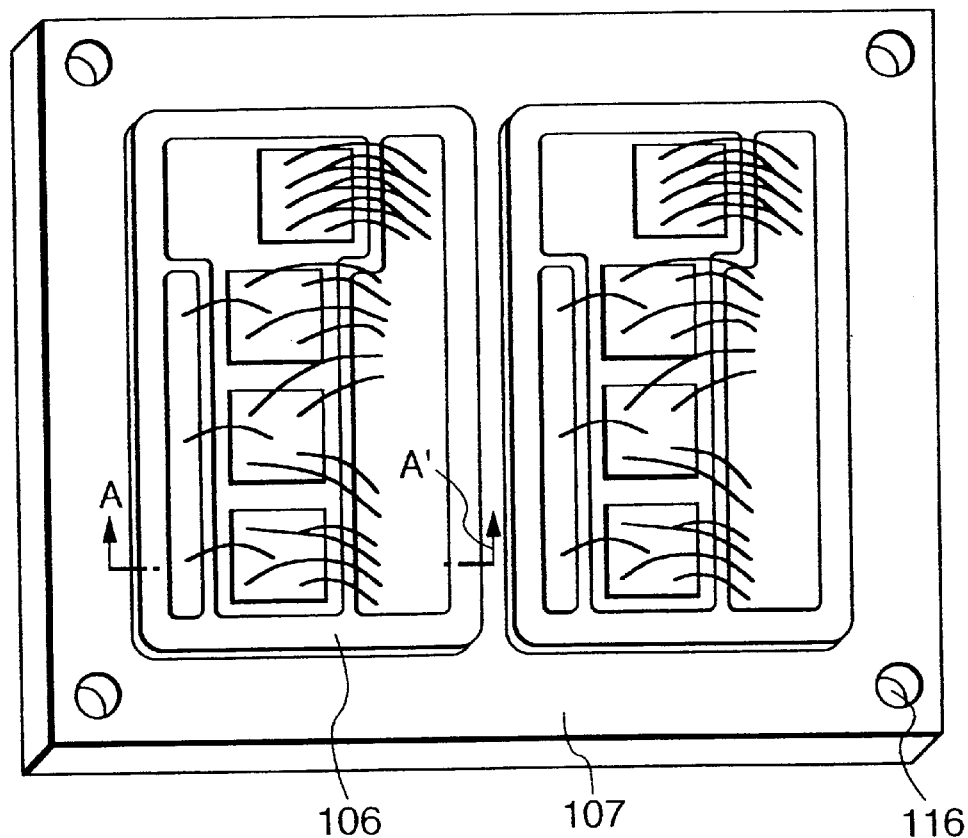
FIGS. 10(a) and 10(b) are a perspective and cross sectional view of the first example of this invention, respectively.
Figure 10B:
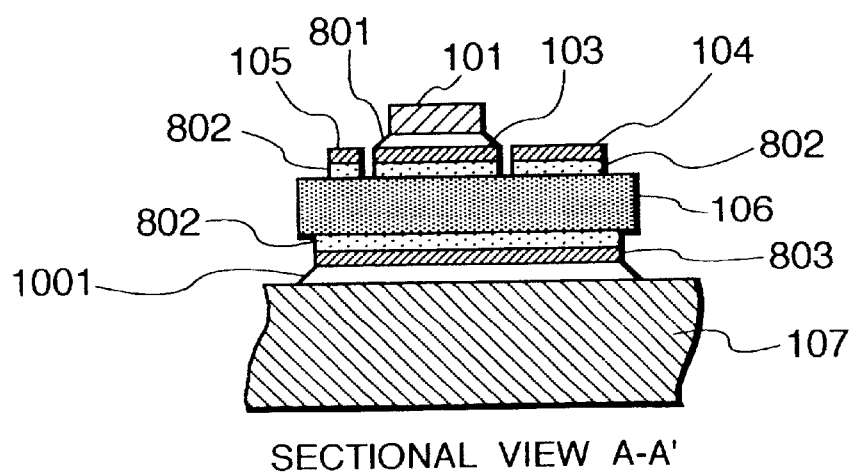

Four terminals are provided outside the module including two main terminals (collector terminal 119 and emitter terminal 120), one gate terminal 129 and one auxiliary emitter terminal 130. When the number of terminals outside the module is minimum, usability of the module is also improved. FIGS. 10(a) and 10(b) show the appearance and cross section of the first example of the result of a manufacturing process of this invention. This first example of this invention has two structural units each structural unit 106 comprising one aluminum nitride substrate.

Figure 8A:
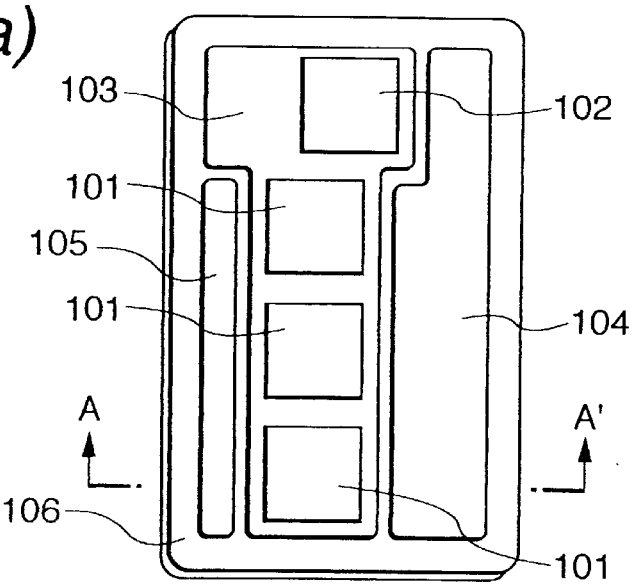
FIGS. 8a and 8b show a perspective view and a cross sectional view of the first example of this invention, respectively.
Figure 8B:
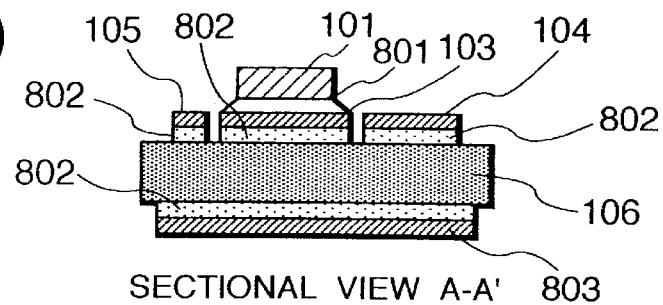
Figure 9:
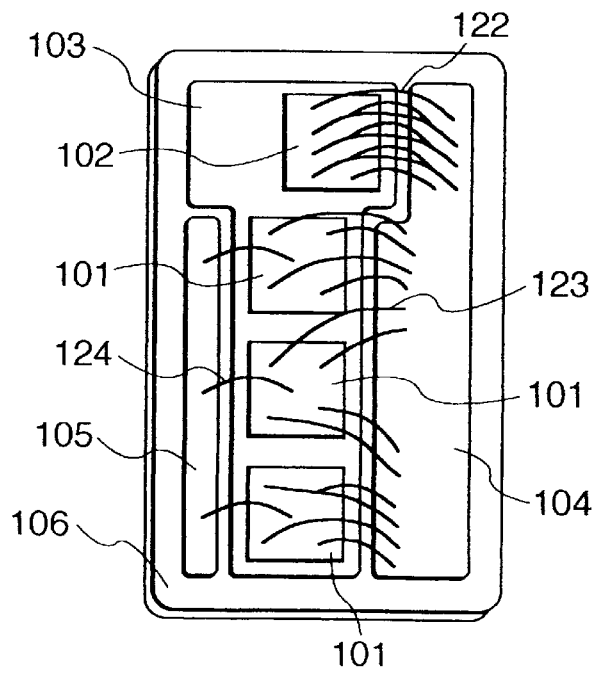
FIG. 9 shows a perspective view of the first example of this invention.

FIGS. 8(a) and 8(b) show the appearance and cross section of the result of a manufacturing process related to each structural unit. Four silicon chips are mounted on the aluminum nitride substrate 106. Free wheel diode chip 102 is shown at the top of FIG. 8a, and the other three chips shown at lower places of FIG. 8a are insulated gate transistor chips 101. The three insulated gate transistor chips 101 and the free wheel diode 102 have the same external dimension. Each of them has a width of 10 mm. The chips in the structural unit are arranged in a line. The position of the free wheel diode chip 102 is deviated a little to the right from the insulated gate transistor chip 101. Consequently, a relatively large area could be secured in copper foil pattern 103 for collector wiring at the left side of the free wheel diode chip 102.

Figure 1:
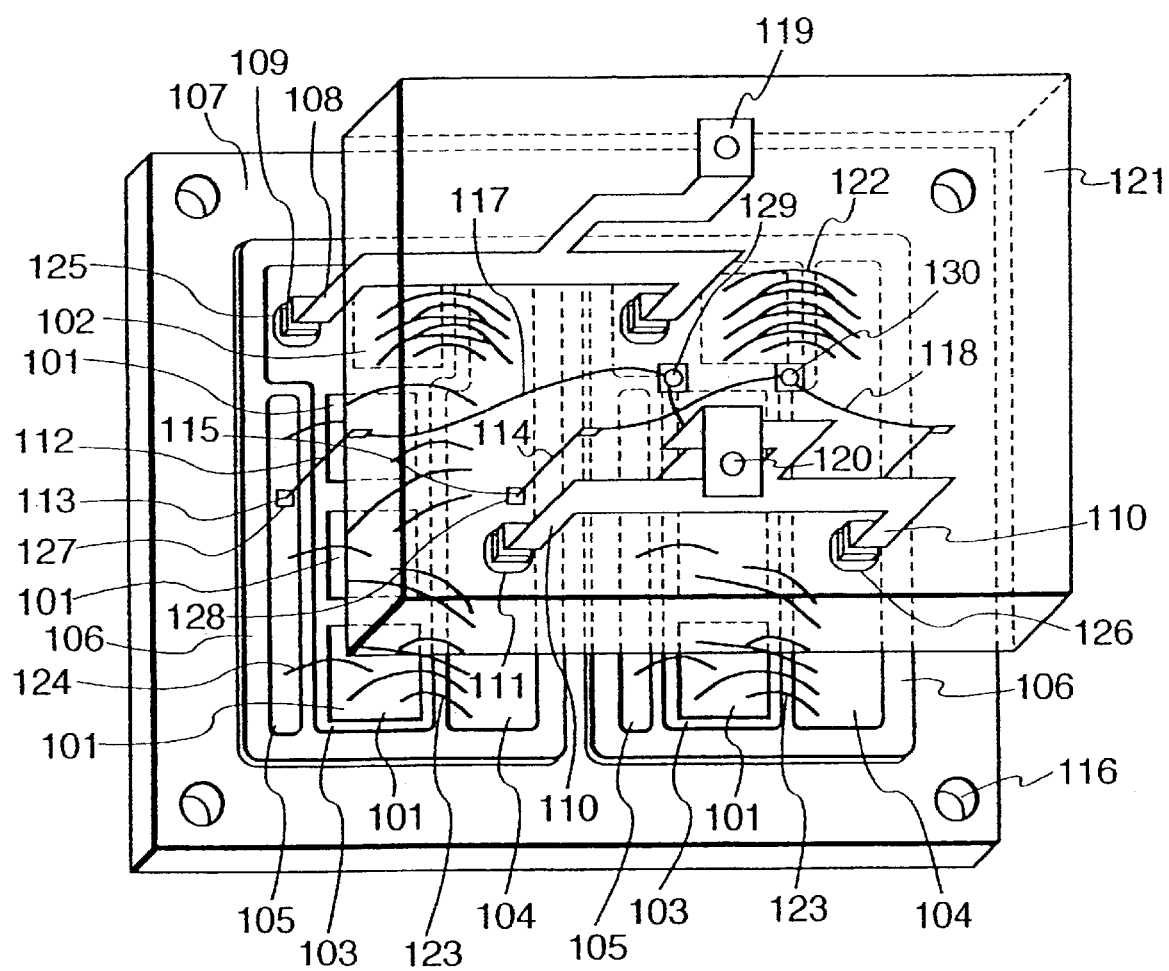
FIG. 1 shows a partially transparent, perspective view of a semiconductor module of this invention.

On the other hand, the width of the copper foil pattern 104 for emitter wiring on the right side of free wheel diode chip 102 is narrower than that of the right side of the insulated gate transistor chip 101. The copper foil pattern for the emitter wiring is narrow, but its width is 8 mm. Thus, there is no problem of wire bonding, as is apparent from the state shown in FIG. 9 in which wire bonding of aluminum fine wire was carried out after the assembly of FIG. 8(a) is completed. There is a space for copper foil pattern 104 on the right side of insulated gate transistor chip 101. These margin spaces, such as copper foil pattern 103 for collector wiring and copper foil pattern 104 for emitter wiring, are used as a place for the bonding of collector terminal foot 108, emitter terminal foot 110 and auxiliary emitter terminal feet 114, as shown in FIG. 1.

When a bonding place is arranged on the longitudinal side of aluminum nitride substrate 106, the length of the diagonal dimension of the aluminum nitride substrate 106 can be made small. This example is compared with the case where bonding positions are located along the short side. In this example, a longitudinal side and a short side of the aluminum nitride substrate 106 are 58 mm long and 42 mm long, respectively. The area of the substrate is about 2400 square mm, and the length of the diagonal is 71.6 mm. For a short side dimension, the area is about 2400 $mm^2$ and the diagonal length is 71.6 mm.

When a bonding place is located along the short side, the longitudinal side dimension and the short side dimension are 74 mm and 38 mm, respectively. The area is about 2800 $mm^2$, and the diagonal length is 83.2 mm. Since aluminum nitride is a brittle material, the structure should be such that stress is not imparted thereto. It is the most effective countermeasure that the diagonal length is made small. It is important to arrange a bonding place on the longitudinal side of the aluminum nitride substrate 106 as in this example. The emitter terminal foot 110 is bonded on the perpendicular bisector of the center of gravity at both ends of three insulated gate transistor chips. This structure is effective for arranging the inductance of the wiring of the emitter side. The insulated gate transistor chips are driven by a voltage. The voltage between gates and emitters must be adjusted in order to normalize an electric current rising curve immediately after gate-on between the insulated gate transistor chips 101. It is necessary to adjust the inductance of the wiring of the emitters of the insulated gate transistor chips 101.

When the inductance of the wiring is adjusted, the emitter electric potentials of the insulated gate transistor chips 101 and the voltages between the gate and emitter are also adjusted. This arrangement can be realized by providing points for bonding terminal feet on the longitudinal side. The copper terminal feet are such that a necessary number of fine copper rods of long strips, which have been subjected to heat treatment for softening, are inserted into the resin cap, and the position of the tips and height of the copper rods are adjusted.

Cream solder or molten solder was coated on the tips of the terminal feet, and all necessary terminal feet for one module were bonded collectively. All tips of the terminal feet were bonded with the metallized pattern surface of the aluminum nitride substrate. This bonding position was arranged to the end part on the longitudinal side of the aluminum nitride substrate. As already described, aluminum nitride, especially aluminum nitride having copper foils on both surfaces, as used in this invention, is fragile.

The main cause of breaking is due to the different coefficients of thermal expansion between aluminum nitride and copper. Thus, it is necessary to reduce the dimension of the aluminum nitride to a small value. The soldering position described here is a practical measure to decrease the diagonal length of the aluminum nitride. Making the dimension small is also effective for an alumina substrate. The insulated gate transistor is of the voltage driving type, and so it is necessary to adjust the voltages between an emitter and a gate in the time period when an electric current is not stabilized immediately after gate turn-off as well as just before gate turn-on. Because an electric current hardly flows into the gate, the electric potential in the gate does not change too much with respect to the chips. The main electric current flows in the emitter. When the inductance from the power source to the chips is not adjusted, the voltage of the emitter immediately after gate turn-on is not adjusted.

Gate turn-on characteristics are determined by the gate voltage applied to each chip, i.e. a voltage between the gate and the emitter. It is important to adjust the inductance of the wiring through which the main electric current of an emitter flows. The inductance is basically proportional to the wiring length, thus it is necessary to adjust the distance from the emitter terminal to each emitter of the insulated gate transistor. For arranging each insulated gate transistor 101 with strictly equal distances from emitter terminal foot 110, each of the insulated gate transistor chips should be arranged on an arc whose center is the emitter terminal foot 110. But, this is impossible as a matter of fact. Then, the distance between the emitter terminal foot 110 and the insulated gate transistor chips 101 located at the remotest positions is adjusted, as in this example.

Turning to FIGS. 8(a) and 8(b), aluminum nitride substrate 106 and the silicon chip thereon will be explained. First, an arrangement of the chip will be explained. All silicon chips are arranged in almost one line. Considering the inductance of the emitter wiring described above, it is ideal for insulated gate transistor chips 101 to be arranged on the same circumference around the center of the bonding point of the emitter terminal foot 110, though this is not illustrated. In this arrangement, a useless place is formed on the aluminum nitride substrate 106, thereby to increase the thermal stress in the bonding point and lower the reliability. Because insulated gate transistor chip 101 is a three terminal element, the emitter wiring and gate wiring should be compatible with each other to adjust the inductance of both wirings. For this reason, the straight line arrangement is most rational. As already described, aluminum nitride is a brittle material, and so a cause for cracking must be removed at the utmost. The four corners of the aluminum nitride substrate are rounded off or chamfered in a radius of curvature of 0.5 mm or more.

The corners of the copper foil pattern are also chamfered in a radius of curvature of 0.1 mm or more. Cracks often occur at the portion of an acute-angle, thus employment of the structure is effective. The aluminum nitride has a coefficient of thermal expansion close to that of silicon. This is a limitation for metallization of the surface of the substrate. A large difference in the coefficient of thermal expansion with a metal causes cracks. As already described, because the aluminum nitride is brittle, cracks may easily occur in the substrate. Alumina has a small coefficient of thermal expansion which is one per several times of that of copper, and has the same problem as the aluminum nitride. Thus, a metallized layer is formed on the both sides of the substrate so as to balance the thermal stress that occurs on both sides.

Although one side of the substrate is a full single pattern which is bonded to a metal plate, the other side is divided into several patterns which function as wiring to chips. Accordingly, the stress of the metallized layer on the full single pattern side becomes larger. Then, the thickness of the metallized layer on the full pattern side is made thinner than that of the wiring pattern to be bonded to the chips. In order to release heat to the outside, aluminum nitride substrate 106 is used, which has high thermal conductivity and good electric insulation. Since the coefficient of thermal expansion of the aluminum nitride is close to that of silicon, the substrate is effective for increasing the heat fatigue resistant life at the soldering positions of the insulated gate transistor chip 101 and the free wheel diode chip 102.

The bonding surface of aluminum nitride substrate 106 to which molybdenum substrate 107 is bonded is fully metallized. The rear surface of the substrate is metallized, too. The metallized rear surface of the substrate is divided into several parts as mentioned above. This rear surface of the substrate is not only the bonding surface for insulated gate transistor chips 101 and free wheel diode chip 102, but also provides a function of supplying the electric current or voltage. Because the aluminum nitride is brittle, it is necessary to repress the diagonal length or to form curvatures to the end parts of both substrate and copper foil patterns thereby to repress heat stress. The reason why insulated gate transistor chip 101 and free wheel diode chip 102 are made the same size in this example will be explained.

When the loads applied to insulated gate transistor chip 101 and free wheel diode chip 102 are considered, the peak electric currents are almost the same for both of them. The time (duty) in which an electric current flows in the free wheel diode is almost half that of the insulated gate transistor. The saturation voltage of the free wheel diode is smaller than that of the insulated gate transistor. Considering the above, the calorific quantity of free wheel diode chip 102 becomes about one third that of insulated gate transistor chip 101. Then, the structure of the chips should be considered. The module of this invention is related to a high voltage resistance and large electric power. Accordingly, a countermeasure for keeping voltage resistance is disposed around the chips to alleviate an electric field.

This part is arranged in the peripheral part of the chips with a constant width without being connected to the chip. The width is the same for insulated gate transistor chip 101 and free wheel diode chip 102. As is described above, because the load for free wheel diode chip 102 is about one third that of insulated gate transistor chip 101, if the number of both chips is made the same, the size of the free wheel diode chip 102 can be made smaller. When the chip is made small, the structure for alleviating the electric field in the chip area can be increased. Even if the electric current capacity (i.e. an area of the active area in the chip) is made one third, the chip size does not become so small. The yield at the time of chip manufacture does not rise so much, either.

On the other hand, when free wheel diode chip 102 is made the same size as insulated gate transistor chip 101, the chip arrangement becomes simple and profitable. For the above reason, both insulated gate transistor chip 101 and free wheel diode chip 102 are made the same size in this example. A highly reliable bonding structure will be explained with reference to FIGS. 10(*a*) and 10(*b*). As a material for solder 801 beneath the chip in this example, there was used a solder containing tin as the main component, 5% of antimony, and small amounts of nickel and phosphorus. Because this solder is relatively hard among the low melting point solders, the solder has not been regarded as proper bonding for a chip.

In recent years, the solder strongly bonds the chips and the base layer thereby to improve the heat fatigue life; thus, the solder has been widely used as a solder beneath the chip, i.e. a solder for bonding chips to a substrate. When only this solder is used, insulated gate transistor chip 101 and aluminum nitride substrate 106 are directly integrated. Thermal stress is imparted to molybdenum substrate 107 beneath aluminum nitride substrate 106 as bending stress. Molybdenum substrate 107 which is a very hard material is hard to bend. As a result, large mechanical stresses are applied to insulate gate transistor chip 101 by electric power, temperature-change on one day and temperature-change in a year, etc., which leads to destruction of the chip in a relatively short time.

A high melting point and relatively soft tin-lead base solder have heretofore been used as an under chip solder. Therefore, even if the substrate is hard and is difficult to be bend, a large stress was not imparted to the chip. The reliability of the chip in case of the tin-lead base solder was higher than that of the case where the tin-antimony base solder was used. The soldering part beneath the chip absorbed all distortions to secure a sufficient reliability of the soldering part.

Improvement in reliability of the whole bonding structure of the module as well as of the chip has been desired. When the tin-antimony base solder by which a potentially high-reliability is expected was used, a soldering structure providing high reliability for the whole module was needed. A tin-lead series solder containing 40% by weight of lead was used in this example as solder 1001 for fixing the aluminum nitride substrate. The Young's modules of this solder is about half that of the tin-antimony series solder that is used as solder 801 under the chip. If a sufficient thickness of the solder is secured, an effect for relieving stress by using the tin-antimony solder can be expected. As solder 1001 for fixing the aluminum nitride substrate, there was used a solder sheet that is made of a solder consisting of 40% by weight of lead and the balance being tin into which 1% by volume of nickel grains of 50 to 80 $\mu$m in diameter was kneaded. Because Ni grains disperse to the soldering surface at the time of soldering, a minimum thickness of 80 $\mu$m for the soldering part is necessary. The flexibility of this soldering part increases and a bending stress produced in solder 801 under the chip car be perfectly absorbed in the layer of solder 1001 for fixing the aluminum nitride substrate.

A solder bonding structure with high reliability in the module is shown in detail by FIG. 4, which shows a part of a cross section of a module of the present invention. An external wall is composed of metal plate 212 covered with nickel plating 423 and resin case 211. Insulated gate transistor chip 401 is bonded by solder 406 under the chip to copper foil 408 for collector wiring bonded on the surface of aluminum nitride substrate 420 with silver solder 421. Aluminum pad 405 for connecting insulated gate transistor chip 401 is connected with copper foil 409 for gate wiring by a gate wire 403. Aluminum pad 404 for an emitter connection is connected to copper foil 410 for emitter wiring by emitter wire 402. These are finally connected to gate terminal 209, an emitter terminal (not illustrated) and an auxiliary emitter terminal (not illustrated). The main terminal (i.e. a terminal in which the main electric current flows) is not illustrated in this figure. All wiring of the main terminal in the module is provided by the terminal feet. However, gate wiring and auxiliary emitter wiring use both the terminal feet and stranded wires covered with an insulating material. Since gate wire 415 for connection of structural units and auxiliary emitter wire 416 for connecting structural units connect the structural units, the number of the terminals coming out to a module outside is two, i.e. gate terminal 209 and the auxiliary emitter terminal (not illustrated). As connecting wires for the gate and auxiliary emitter, there is used a stranded wire coated with fluorine-containing resin.

Insulated gate transistor chip 401 is covered with silicone gel 424 so that the chip is protected from changing its electric characteristics by water which may seep into insulated gate transistor chip 401 through resin case 211. Epoxy resin 425 having good adhesiveness with resin case 211, is filled between silicone gel 424 and resin case 211. Epoxy resin 425 operates to lower the invasion speed of water. The terminal feet are made of a material having nickel plating 419 on the surface of the copper foil that was softened by heat treatment in advance.

The coefficients of thermal expansion of the resin case 211, epoxy resin 425 and silicone gel 424 are larger than that of any metal. Particularly, because the silicone gel has an expansion coefficient equivalent to that of liquid, a large displacement occurs in gate terminal feet 414 for connecting external terminals and the auxiliary emitter terminal feet 413 for an internal connection due to a change of the ambient temperature. Thus, bended parts 417 of terminal feet are provided on the terminal feet in the vicinity of the terminal feet tip solder 418 so that too much thermal stress is not given to the terminal feet tip solder 418. While this measure is not being illustrated, the same countermeasure is employed for the main terminal. Stress also is imparted to terminal feet when the external terminals are screwed down.

Terminal feet bended parts 417 also have the effect that this external stress is not exerted on terminal feet tip solder 418. In the following, the solder used in the module will be described. A solder containing tin and antimony as main components is used for solder 406 under the chip. This is the hard solder that has a lot of Sn. When this solder is used under the silicon chip, it is seen that thermal fatigue resistance of the bonding part is improved. As the solder is hard, distortion due to thermal fatigue is hardly imparted to the solder. According to our knowledge, when the content of Sb is 4 to 6% by weight, the improvement in reliability of the bonding parts and good solder ability are obtained. The reactivity of solder becomes high when the content of Sn becomes 90 weight % or more, and so the metallized layer of the back face of the chip is easily eroded. Thus, Ni which is relatively resistive to erosion by solder is added to the solder for the multilayer solder, thereby to suppress the reaction of solder. Likewise, nickel plating 412 also is formed on copper foil 408 for the collector wiring which solder 406 under the chip touches in order to repress erosion to the utmost.

Now, there will be described the bonding place of the metal plate 212 for back face bonding of the aluminum nitride substrate 420 and copper foil 411, in which the place is another bonding place of the module type semiconductor package of the present invention. The feature of the bonding part of the solder 422 for fixing the aluminum nitride substrate is that it is a large bonding area. It is necessary that the solder has a good wettability and little void-forming.

As wettability of the above tin-antimony base solder is not very good, the tin-antimony series solder is not suitable for bonding this part, because flexibility is necessary for this bonding part. Since solder 406 under the insulated gate type transistor chip, shown in FIG. 4, is hard in the whole layer structure ranging from metal plate 212 to transistor chip 401, there is not a flexible part other than the adhesion place of the copper foil 411 and the metal plate 212 for bonding the back face of the above aluminum nitride substrate.

While the heat distortion of the module shown in FIG. 4 is small, this structure relatively tends to increase the heat distortion. It is desirable for solder 422 for fixing the aluminum nitride substrate to be sufficiently soft so as to alleviate thermal stress. As the solder material that satisfies the following two requisites, a solder containing Sn and Pb as main components with high heat fatigue resistance was adopted:

a) Good wettability for bonding in a large area; and b) Sufficiently soft solder.

The solder of this composition series has a Young's modules off about half that of the tin-antimony series solder and is sufficiently soft, even when it has a composition close to the eutectic composition which is relatively hard. Therefore, the solder fulfills a function as a stress absorption layer in the whole layer structure shown in FIG. 4. Moreover, the solder of this composition has good wettability. There is not an adequate composition series solder other than the above solder for the bonding parts. This bonding part uses a solder of a composition close to the eutectic composition having a low melting point, because this bonding process is carried out after the bonding process using the tin-antimony series solder.

Figure 7:
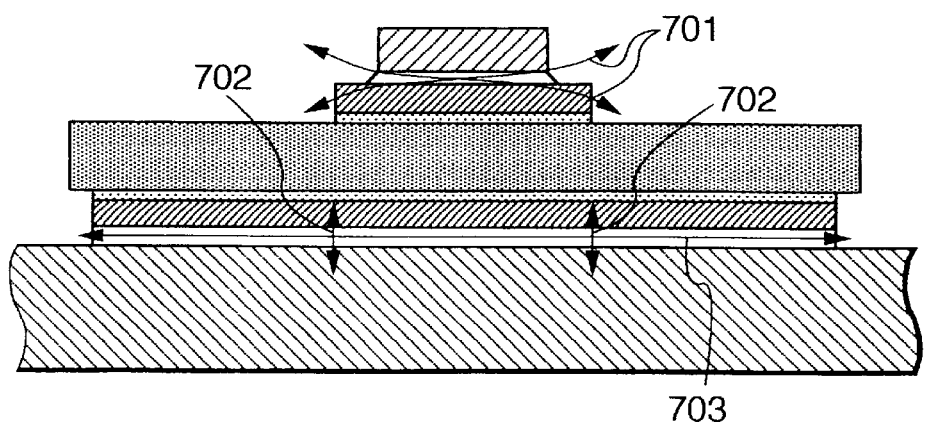
FIG. 7 shows a cross sectional view of the first example of this invention.

As shown in FIG. 7, in the multilayer structure of this invention, there are used a hard tin-antimony base solder and a soft tin-lead base solder. The chip and aluminum nitride or chip and alumina are bonded by a hard tin-antimony base solder with high reliability against thermal fatigue. Accordingly, the chip and the aluminum nitride substrate or alumina substrate expand and shrink as if they were integrated. As the chip and the aluminum nitride substrate or the alumina substrate function like a bimetal, the thermal stress is absorbed as shown in bending direction 701. While the aluminum nitride substrate or alumina substrate follows this bending so as to be deformed, the metal plate resists the bending. When considering the installation of a heat sink outside the module, it is preferable that the metal plate is not bended. Then, the thickness was kept larger than a certain value by adding nickel grains to the solder bonding layer so that the flexibility of the solder bonding part was secured.

A bend which occurs in the Sn—Pb series solder layer beneath the chip is absorbed as a tension and compression in the pulling direction 702 shown in FIG. 7. In addition, the thermal stress which has occurred in the bonding part, between the aluminum nitride substrate or alumina substrate, each having a large bonding area, and the metal plate, is absorbed as a shearing distortion in the solder so that the metal plate expands and shrinks freely. Shearing direction 703 in the solder is shown in FIG. 7. The countermeasures suitable to suppress stress degradation were employed in the above structures. These countermeasures were realized by proper use of the Sn—Sb series solder and the Sn—Pb series solder. Because the hard Sn—Sb solder was used for the solder beneath the chip, only a layer between the aluminum nitride or the alumina substrate and the metal plate becomes a flexible layer.

It is difficult to secure reliability of the module in case of the aluminum nitride being brittle, to which connection is made. This bonding part serves to relieve stress due to the difference in the thermal expansion coefficient of the whole layer structure. Although a soft tin-lead series solder is used for the bonding part, the use of only the soft solder is insufficient. The soldering thickness of the adhesion part is an indispensable requisite to positively secure flexibility. A certain quantity of the nickel grains is admixed as a spacer in the solder, so that the soldering thickness of the bonding part is kept constant. On this occasion, the mixing ratio is adjusted so that two or more of the nickel grains are not overlapped and there are at least three grains in the soldering area.

According to the result of our examination, desirable are nickel particles of 40 to 100, $\mu$m in a volume ratio ranging from 0.1 to 3% are desirable. The area for soldering the chip is small, compared with the soldering part between the aluminum nitride or alumina and the metal plate; therefore, the mechanical property of solder may be changed by adding nickel grains to the solder so that the reliability is greatly improved. Because this soldering part is integrated by the use of a hard tin-antimony series solder, a thick solder layer is not always highly reliable. Accordingly, it is not desirable that nickel grains are admixed in this part.

The wiring pattern and arrangement of components in each unit on the surfaces of the structure units are preferably asymmetric in all directions i.e. up and down, and right and left directions. The main reason for the asymmetrical arrangement of components on the surfaces resides in that the insulated transistor chip 101 and the free wheel diode chip 102 are installed thereon. The main reason why the arrangement of components on the surfaces is asymmetric in right and left directions reside in the fact that the insulated gate transistor chip 101 is a three terminal device, so that emitter wiring and gate wiring are necessary. As shown in FIG. 10, two structural units are arranged in the same direction in this example. Consequently, as shown in FIG. 1, collector terminal foot 108 and emitter terminal foot 110 are asymmetric in right and left directions.

As shown in FIG. 1, strand wire covered with a thermal-resistant resin was used for the gate wiring and the auxiliary emitter wiring between structural units. These are gate connecting wire 117 and auxiliary emitter connecting wire 118 between structural units. By using the strand wire, the degree of freedom of wiring routes increased and gate connecting wire 117 between structural units can be bundled with auxiliary emitter connecting wire 118 between structural units so as to avoid induction noise. As mentioned above, the insulated gate transistor is of the voltage driving type, and the wiring among the gate driving circuits outside the module can be made rough as compared with the electric current driving type device.

In the module, the main electric current circuit is arranged close to the gate driving circuit. The insulated gate transistor is of the voltage driving type whose gates have a high impedance. Accordingly, the wiring for driving the insulated gate transistor will easily pick up an induction noise. Therefore, it is desirable that the gate wiring and the auxiliary emitter wiring to be placed as close as possible in order to repress a voltage variation.

It is better to twist the wires on each other if possible. Thus, the structure of this example is a desirable constitution. In addition, the gate wiring and the auxiliary emitter wiring in the place where the wirings are close to the main electric current circuit should be arranged so as to traverse the main current circuit at substantially a right angle, thereby avoiding any influence of induction noise.

Figure 13:
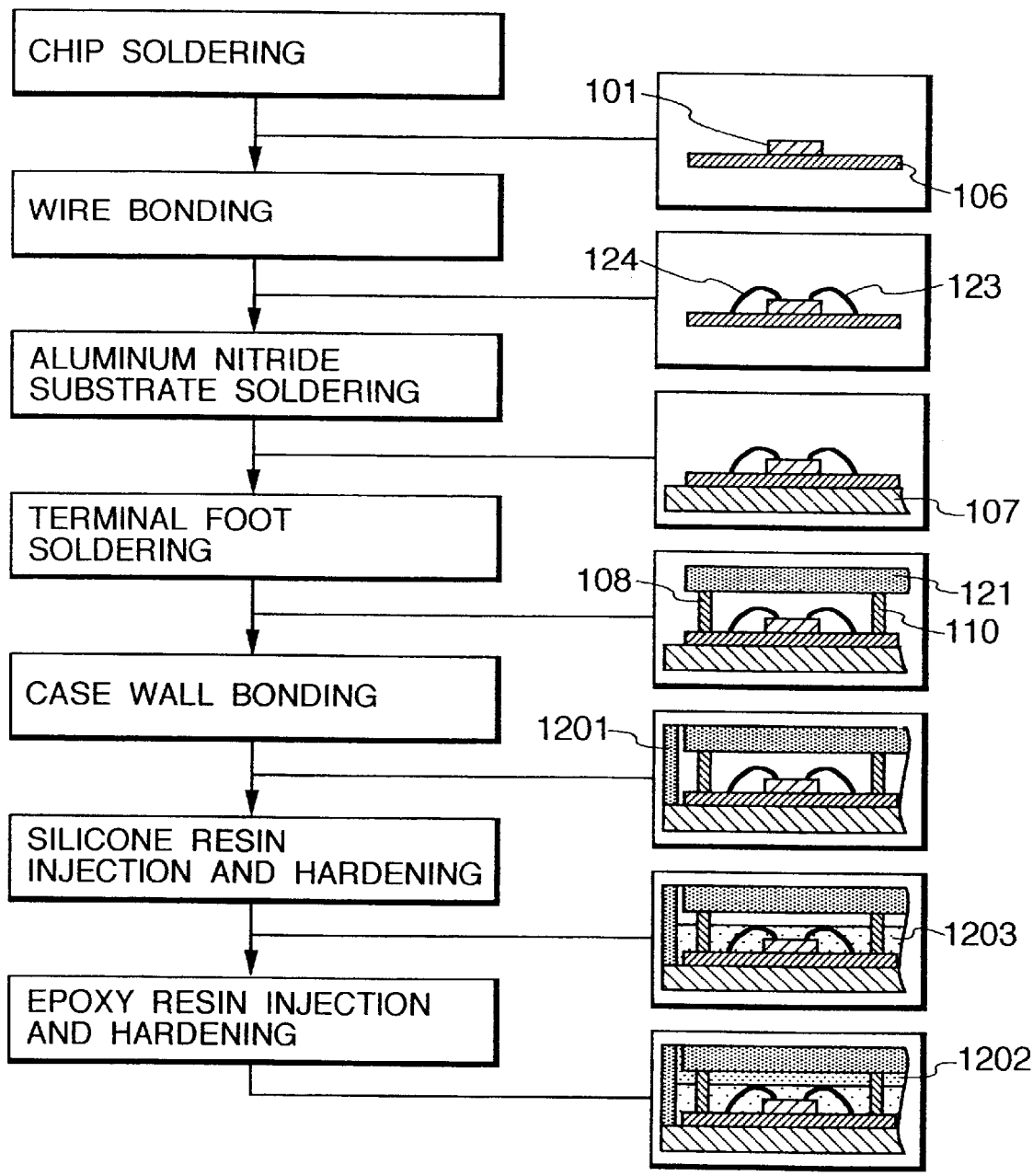
FIG. 13 shows a process diagram of the first example of this invention

The manufacturing process of this example will be explained in accordance with FIG. 13, which shows steps on the left side and sectional views of a module after the steps are finished at the right side.

(1) Soldering of Chips

Chips (insulated gate transistor chip 101 and free wheel diode chip 102) were soldered to aluminum nitride substrate 106. The solder is 5% by weight of antimony, the balance being tin solder, as already described. Soldering was conducted under a condition of a maximum temperature of 280° C. in a pure hydrogen atmosphere, the dew point of which was controlled to 40° C. or lower.

(2) Wire Bonding

Solid phase joining by ultrasonic processing was conducted by using pure aluminum wire which was softened by heat treatment, the diameter of the wire being 0.4 mm. Four wires per one insulated gate transistor chip 101 were bonded to emitters, one wire to a gate and twelve wires to anodes of the free wheel diode chip 102.

(3) Soldering to Aluminum Nitride Substrate

By using solder consisting of 40% by weight of Pb the balance being Sn and containing 1% by volume of nickel grains, soldering was conducted under the condition of maximum temperature of 230° C. in pure hydrogen atmosphere controlled to a dew point of −40° C. or lower. The condition of this maximum temperature is that the tin-antimony solder does not re-melt.

(4) Soldering of Terminal Feet

The terminal feet are fixed to case lid member 121. The bended parts are provided for alleviating the stress due to the thermal expansion coefficient difference with the case material, and molybdenum substrate 107 and aluminum nitride substrate 106 are provided to the tip of each terminal foot. The bended parts 109, 111, 113 and 115 are provided to the collector terminal feet, emitter terminal feet, and auxiliary emitter terminal feet shown in FIG. 1. The Sn-40% by weight of Pb solder grains were made into a paste with soldering flux. The resulting paste solder was put on every tip of all terminal feet, and then all terminal feet were collectively soldered. The atmosphere was air at the maximum temperature of 220° C. After soldering, the residual flux was rinsed with water.

(5) Adhesion to Case Wall

Case wall 1201 was bonded to molybdenum substrate 107 with a heat resistant adhesive. The adhesion was carried out at a temperature of 150° C. in an air atmosphere.

(6) Hardening of Silicone Resin

A silicone resin was injected into a package, and it was hardened at 150° C. in an air atmosphere. As a large quantity of gas is involved in the resin, de-bubbling was performed in vacuum before hardening. Silicone gel 1203 was injected to a level above the maximum height of the bonding wires.

(7) Injection and Hardening of Epoxy Resin

Epoxy resin was injected and hardened. The hardening atmosphere of the epoxy resin was air and the hardening temperature was 150° C. Then, the semiconductor module of this example was completed.

Next, the advantages of this example will be explained. The reliability of the module is determined by the soldering parts. The collector electric current of the insulated transistor chip 101 and the cathodic electric current of free wheel diode chip 102 flow in the soldering parts, especially in the solder 801 under the chip.

At the same time, the heat produced in the insulated gate transistor chip 101 and the free wheel diode chip 102 flows in the soldering parts. When cracks occur in the soldering parts, their electric characteristics and heat characteristics are quite affected. A great influence on the heat characteristics is due to cracks in the solder for the aluminum nitride substrate fixation and cracks in the solder just under the insulated gate type transistor chip 101 and free wheel diode chip 102.

The test was repeated in which a temperature at the bottom face of the molybdenum plate 107 was changed within the range of 70° C. by switching the operation on and off. The module type semiconductor package of this example showed reliability of double or more of the conventional module which used Sn—Pb system solder under the chip.

Next, the electric characteristics of the module of the present invention will be described. The module should control a large electric current, thus the induction components of the emitter wiring must be controlled to the same extent as much as possible. When it is observed from the external terminal of the module, the electric current concentrates in some of the chips. When the difference in the inductance among chips exceeds 10 nano henry (nH), the ignition times of each chip scatter remarkably. Consequently, there is a case wherein the chips may be destroyed. Therefore, the difference in the inductance among the emitter circuits must be controlled to 10 nano henry (nH) or less.

As is already described, because the terminals in the module are not symmetric in right and left directions, the inductance is slightly unbalanced. The difference was about 5 nH between the left side structural unit and the other right side structural unit. As for the collectors, the left structural unit has a larger inductance, and as for the emitters, the right structural unit has a larger inductance. However, the total value of the inductance from the collector to the emitter is almost the same. There was a difference of about 3 nH in the emitter wirings among three chips in the structural unit.

As was already described, the emitter wirings were arranged at an equal distance from the insulated gate transistor chips 101 at both ends, and so the unbalance could be made small. The total of the unbalance of the inductance in the emitter wirings was about 8 nH at the utmost.

A plurality of the modules according to this invention are connected in parallel and in series to constitute a large switching system as a whole. If the whole switching system does not operate synchronously, there may be a case where an electric current is concentrated in some of the chips resulting in destruction of these chips. When it comes to the whole system, while the unbalanced electric current becomes fatal in a part in which a large electric current flows, the unbalance is relatively accepted in a part with a small electric current value.

The difference in the electric current between the structural units that are relatively small, compared with the whole switching system, should be controlled to be 1.5 times or less, and the difference in electric current between the modules should be balanced. The balance of an electric current between the structural units was measured in the period from power-on to $10\mu$ seconds. Consequently, the unbalance of an electric current between the left structural unit and right structural unit was 1.3 times at the utmost. If the system has such a value, the system does not impart a large load on a part of the chips and can operate in practical use. When $10\mu$ seconds have passed, the influence of the inductance became negligibly small, and the unbalance of the electric current between structural units was not a big problem.

While an aluminum nitride substrate was used in this example, an alumina substrate can also be used. The difference in thermal expansion coefficient between molybdenum and alumina is almost the same as that in thermal expansion coefficient between molybdenum and aluminum nitride. Accordingly, the absolute value of the thermal stress imparted on the solder (not illustrated) between the aluminum nitride substrate or the alumina substrate and the molybdenum substrate is almost the same. In addition, alumina has a greater toughness than aluminum nitride, and so cracks in the substrate hardly occur. Therefore, there is no need for round portions formed at the corners of aluminum nitride substrate 106 (one mm in radius), round portions at the corners of the copper foil pattern 103 for collector wiring, copper foil pattern 104 for emitter wiring and copper foil pattern 105 for gate wiring (0.1 mm in radius) as shown in FIG. 8(a). Although the structural unit according to this example is composed of two insulated gate transistor chips 101, it goes without saying that the same can be applied to three or four insulated gate transistor chips 101.

An example in which the modules are multiply connected will be explained with reference to FIG. 2, which shows an example in which semiconductor modules of the invention, mounting insulated gate transistors, were applied to an inverter for generating a three-phase alternating current from a direct current power source. The direct current power source is connected to the plus side of direct current input power 201 and the minus side of direct current input power 202. A three-phase alternating current is output from U phase 203, V phase 204 and W phase 205, respectively.

A snubber circuit is inserted so as to prevent excessive electric current to flow to the insulated gate transistor at the time of switching. The circuit is omitted in this figure for simplification of the description. Because of the shortage of the electric current capacity of a single module in the inverter of FIG. 2, two modules are connected in parallel. Four modules are connected in series, because the inverter is a three level device. Each module singly operates in series direction. The emitter of the module atop and the collector of the module at the bottom are connected with a clamp diode to make a three level inverter, but this is omitted from the figure.

To dissipate heat generated in each of the modules, metal plate 212 at the rear end of the modules is screwed through heat conduction grease to common heat sink 206. Collector terminal 207, emitter terminal 208, gate terminal 209, auxiliary emitter terminal 210 and all external terminals are placed on the top surface of resin case 211 of each of the modules. Collector terminal 207 and emitter terminal 208 are placed at almost the center line of the module, and gate terminal 209 and auxiliary emitter terminal 210 are arranged between the main terminals. Therefore, gate wiring 213 for gate driving and auxiliary emitter wiring 214 do not overlap with plate-form wiring 215. This arrangement has the advantage of decreasing the interference of the main electric current to a gate circuit in addition to good workability.

As explained above, the semiconductor module of this invention is easy to use and has a good performance, because grouped semiconductor modules are so arranged that all the external terminals are placed on the top surface of the module, and gate terminal 209 and auxiliary emitter terminal 210 are arranged between collector terminal 207 and emitter terminal 208 as shown in FIG. 2.

According to this example of the present invention, semiconductor modules are provided on which power semiconductor elements, such as insulated gate transistors and diodes are mounted. The modules are applied to a series of different capacity modules.

EXAMPLE 2

Figure 14A:
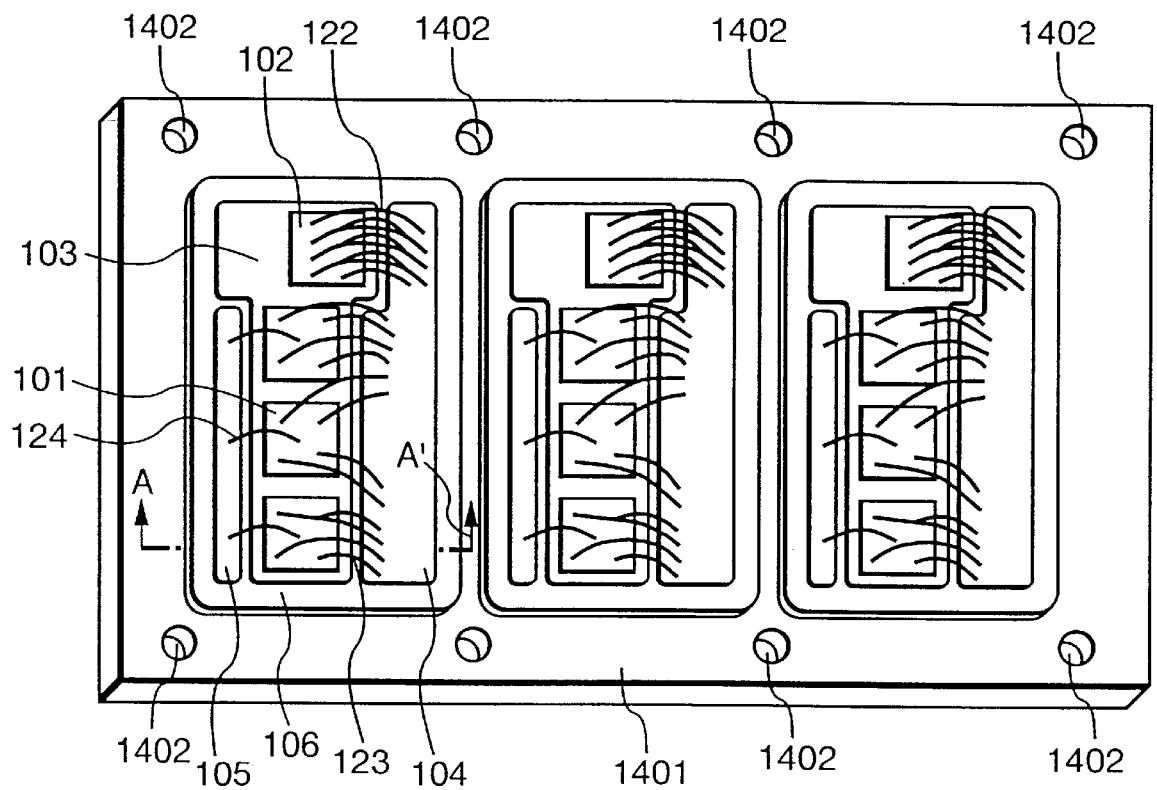
FIGS. 14a and 14b are a perspective view and a cross-sectional view showing the second example of the present invention, respectively.
Figure 14B:
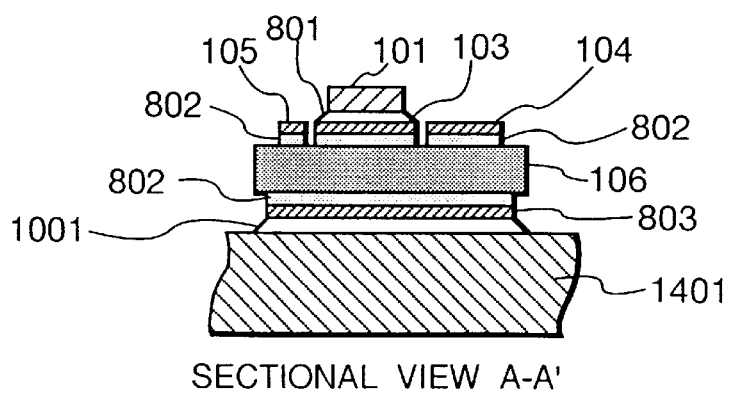
Figure 15:
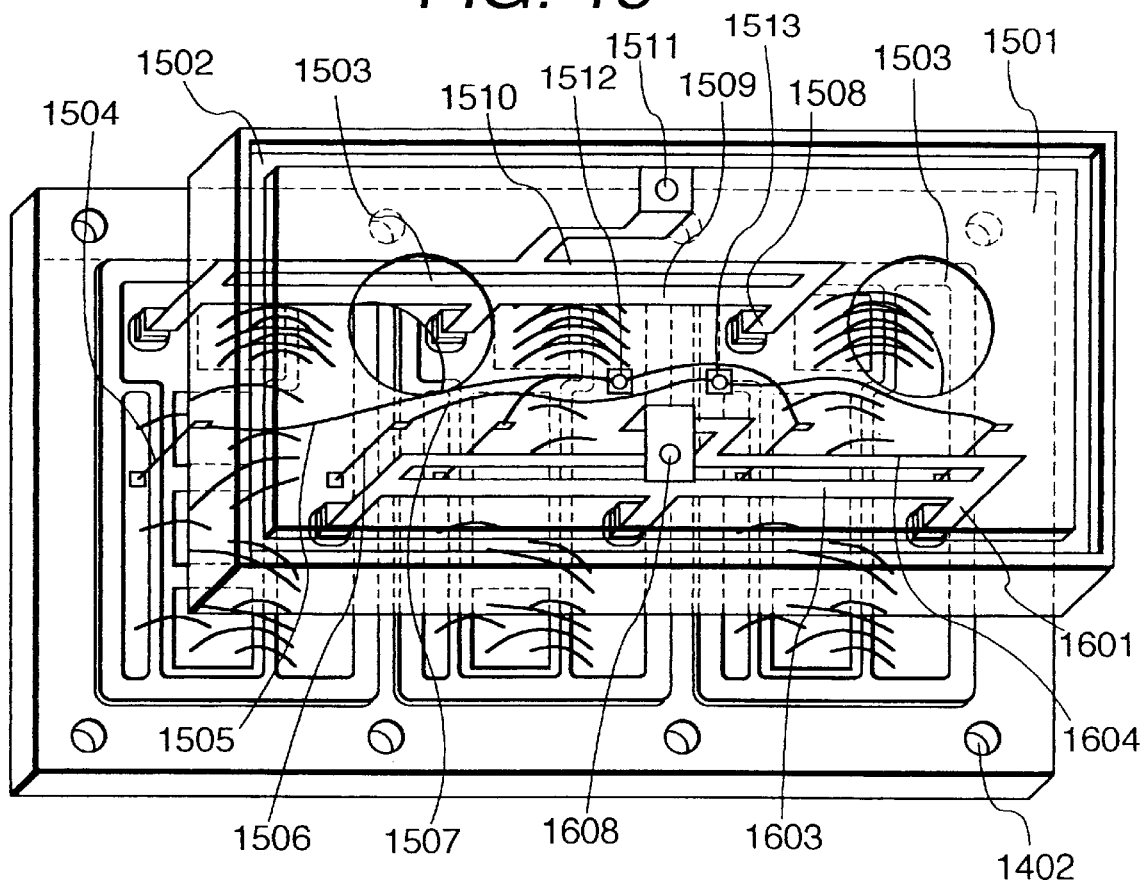
FIG. 15 is a partially transparent, perspective view showing the second example of the present invention.

The second example of the present invention will be explained with reference to FIG. 5, FIG. 14a, FIG. 14b and FIG. 19. FIGS. 14a and 14b show a perspective view of a module and a cross section showing the manufacturing process related to the second example of this invention, respectively. FIG. 15 is a perspective view of a module resulting from the manufacturing process for the second example of this invention and case lid member 1501 is shown as being transparent for ease of explanation.

In the second example of this invention, there are three structural units and each of the structural units has one aluminum nitride substrate 106. Each of the structural units is the same as the first example. The arrangement of the power semiconductor chips and the wiring patterns of each structural unit are asymmetric in right and left and top and bottom directions. All structural units are directed to the same direction in the same manner as the first example. This arrangement of chips and wiring patterns has a remarkable advantage.

As shown in FIG. 15, three collector terminal feet 1508 are arranged with the same spacing each other. Likewise, the emitter terminal feet 1601 are also arranged with the same spacing. By employing this arrangement, the left and the right side terminal feet are arranged with the same intervals when observing them from the central terminal foot. The inductance of the wiring is influenced directly by the length of the wiring. Therefore, it is difficult to adjust the inductance in a parallel connection of three terminals.

In the arrangement of this example, at least the inductance between right and left terminal feet ends is adjusted from the beginning. Therefore, it is sufficient that only the matching of the inductance between the central terminal foot and the terminal feet of both ends should be considered. This is a large advantage of this arrangement.

Figure 16:
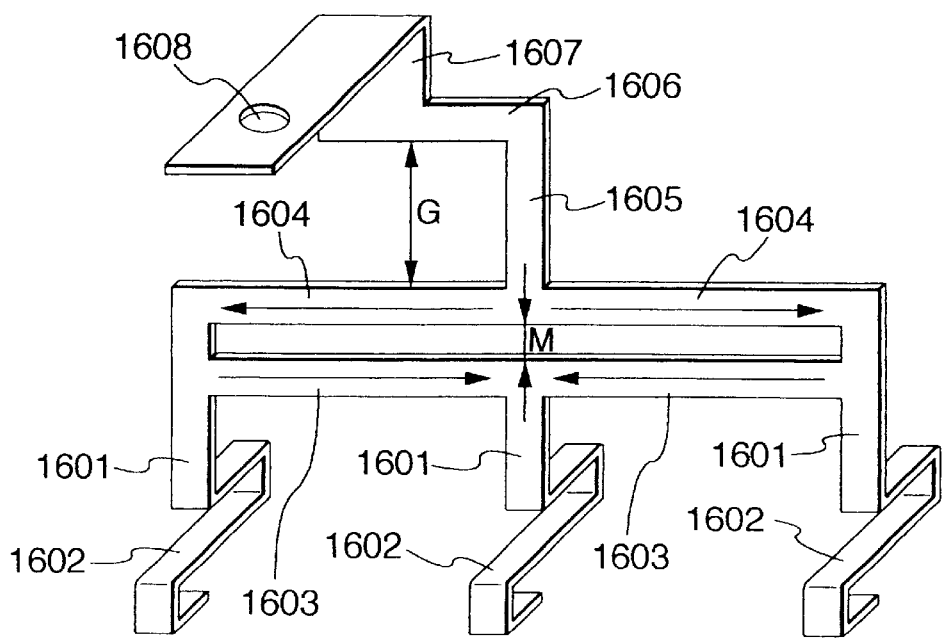
FIG. 16 is a perspective view showing the second example of the present invention.

The matching of the inductance between the central terminal foot and right and left terminal feet, particularly the emitter terminal feet, will be explained by using FIG. 16. Three emitter terminal feet 1601 are arranged on a straight line with the same spacing. To relieve stress due to temperature change, bended parts 1602 are formed at the tips of the emitter terminal feet:.

A case where an electric current flows from emitter terminal 1608 will be explained. The electric current is divided into halves and flows into emitter inductance adjustment terminal foot 1604 through emitter joining terminal foot 1607, emitter position adjustment terminal foot 1606 and emitter joining terminal foot The direction of the electric current is shown by a thick arrow in the figure. One third of all electric current which flows in emitter terminal foot 1601 at the end, and one sixth of the remainder flows in emitter linkage terminal foot 1603. The electric current which flows here is shown by a thick arrow in the figure. As is apparent from the figure, the direction of current flow in emitter inductance adjustment terminal foot 1604 is opposite to that for the electric current flowing in emitter linkage terminal foot 1603.

When the space (M in the figure) between the emitter inductance adjustment terminal foot 1604 and the emitter linkage terminal foot 1603 is sufficiently large, the route to central emitter terminal foot 1601 becomes longer than the route to the emitter terminal feet 1601 at both ends. Accordingly, the inductance to the central emitter terminal foot 1601 becomes larger than the inductance to the emitter terminal feet 1601 at both ends.

On the other hand, when M becomes zero, the distance relationship is reversed and the inductance to the central emitter terminal foot 1601 becomes smaller. M has the optimum value of 10 mm or less, which depends on the shape of the module. In this example, when M was 8 mm, the inductance from the emitter joining terminal foot 1605 to the tip of each of the terminal feet 1601 became the same. Since the electric current flowing in the emitter inductance adjustment terminal foot 1604 and the electric current flowing in the emitter linkage terminal foot 1603 flow in opposite directions, the mutual inductance becomes minus. Because the collector terminal 1511 and the emitter terminal 1608 were arranged on the center line of the module, the emitter position adjustment terminal foot 1606 became necessary for the emitter. Consequently, unbalance occurred in the inductance of the right and left terminal feet. But, this is only a slight unbalance.

The inductance between the left emitter terminal foot 1601 and emitter terminal 1608 was smaller than that between the right emitter terminal foot 1601 and emitter terminal 1608 by about 5 nH. The length of the emitter position adjustment terminal foot 1606 is as short as in the case where the numbers of connecting is 20 mm and the distance G in the figure is as large as 15 mm.

In the case where the number for connecting the structural units in parallel with each other is represented by an equi-ratio sequence of numbers with the common ratio of two, whose initial item begins at two, a pair of the structural units are grouped, and a pair of the grouped structural units are grouped into the higher group. In this manner, a hierarchical structure of the group of terminal feet can be constituted between the emitter terminal and the structural units. However, in the case where the number is not expressed by the above mentioned ratio sequence, the hierarchical structure is destroyed somewhere. In other words, there will be a part where three structural units should be connected in parallel. In this part, an unbalance of the inductance occurs inevitably.

To avoid this unbalance, a part where part of the electric current flows in a reverse direction is arranged in the vicinity of a part of the terminal feet. The electric current flowing in the reverse direction offsets inductance. By adjusting the electric current quantity flowing in the reverse direction and the distance, the inductance between the emitter of three structure units can be brought close to the same or a similar value. One of the features of this example is the use of copper-molybdenum-copper cladding substrate 1401 as the metal plate.

Figure 17A:
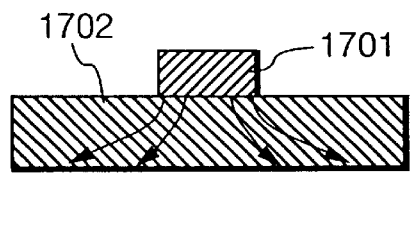
FIGS. 17a and 17b are cross sectional views showing the effect of the second example of the present invention.
Figure 17B:
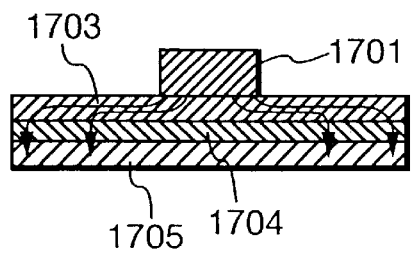

The effect of this will be explained by using FIGS. 17(a) and 17(b), wherein the member comprising the ceramic substrates and the silicon chips is simplified as heat source 1701. FIG. 17a shows a first example, and FIG. 17b shows a second example. The differences between the above examples will be explained.

In FIG. 17a, the heat flows in a smooth line because the molybdenum substrate 1702 is made of a single material. However, in the example shown in the FIG. 17b, there is an upper side copper layer 1703 with a large heat conductivity between the heat source 1701 and the molybdenum layer 1704 having a small heat conductivity, and so heat is forcibly spread in this layer in the horizontal direction of the figure. Therefore, the density of heat flow on the underneath surface of the under side copper layer 1705 in contact with a heat sink (not illustrated) lowers.

Generally, heat conductive grease is applied to the hot junction in contact with the heat sink. While this grease has a larger thermal conductivity than air, it is smaller than that of metal by about two digits. Therefore, the density of the heat flow of a grease layer is important. When the heat flow density on the underneath surface of the under side copper layer 1705 is small, the temperature difference in the grease can be controlled to a small value. Consequently, the total heat resistance, including that of the heat sink, can be repressed and made small. Thus, the temperature increase of the silicon chips can be made small. There is a small temperature load on the grease part, due to an increase of the local thickness of the grease that is caused by fluctuation of the grease thickness due to fine a undulation of the heat sink and the metal plate. The temperature increase on the grease part due to voids in the grease becomes small so that the increase of temperature of a silicon chip can be repressed to a small value.

Under side copper layer 1705 does not participate in the thermal action. Under side copper layer 1705 prevents a bimetal effect, i.e. bending of a plate due to temperature change, in cooperation with the upper side copper layer 1703. The bimetal effect takes place in the case where molybdenum and copper, which have different thermal expansion coefficients, are cladded. The thickness of upper side copper layer 1703, molybdenum layer 1704 and under side copper layer 1705 are three mm, respectively. The coefficients of thermal expansion in the horizontal direction of the three layers (parallel direction for the surface of the board) is 100 ppm per ° C.

While the difference in the coefficient of thermal expansion between the metal plate and the aluminum nitride substrate becomes larger than that of the first example wherein the single molybdenum plate was used, the difference is small. When the thermal expansion coefficient of the metal plate exceeds 10 ppm per ° C., the reliability of the module is deteriorated. The following three functions are required for the metal plate.

(1) Mechanical support
(2) Heat transfer to the outside
(3) Water proof

A further desirable property is that there is little thermal stress at the soldering part with the aluminum nitride or alumina substrate. As a thermal expansion coefficient of the metal plate, 10 ppm or less per ° C. is desirable. The single materials that satisfy these conditions are tungsten and molybdenum. The lamination structure composed of materials having different thermal conductivities from each other is advisable. Single materials are not effective because the heat flow in a direction parallel with the metal plate is accelerated and the temperature distribution in the bottom of the outside of the module is small in single materials.

The materials that have a thermal expansion coefficient satisfying this requirement, i.e. 10 ppm per ° C. or less are exemplified as follows:

Three layer structures such as copper-tungsten-copper, tungsten-copper-tungsten, copper-molybdenum-copper and molybdenum-copper-molybdenum. The reason why a lamination of three materials is employed is to prevent the bimetal effect i.e.,. bending of the metal plate due to a temperature change.

Figure 18:
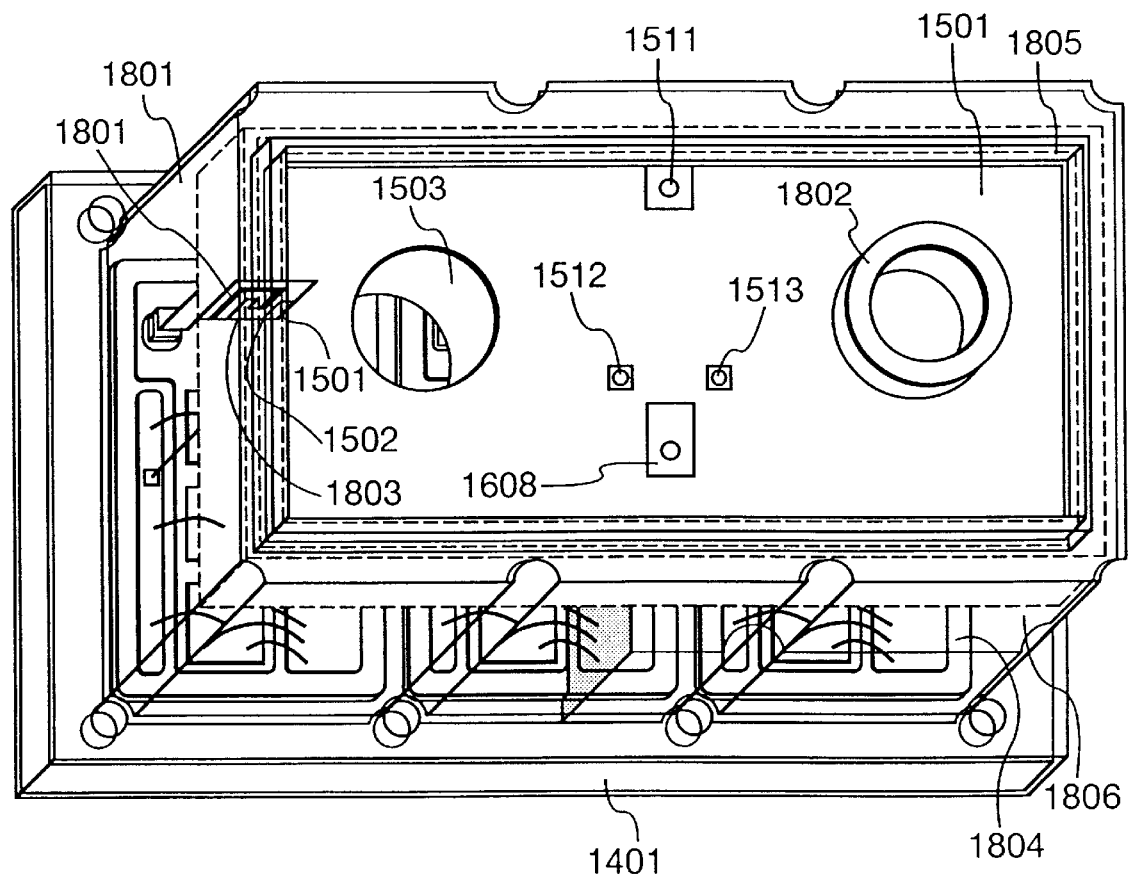
FIG. 18 is a perspective view showing the second example of the present invention.

FIG. 15 shows case lid 1501 having two features that are different from those of the first example. There are formed groove 1502 on the circumference of the case lid and injection hole 1.503 in the case lid. The filling structure of resin in the module is different from that of the first example. This will be explained by using FIG. 18, which shows the second example in the state in which the manufacturing process has advanced further from FIG. 15. In FIG. 18, case lid member 1501 is shown as being opaque, and case wall 1801 is shown as being transparent for ease of explanation. In the part where case lid 1501 and case wall 1801 overlap, case wall 1801 is shown by a thin solid line, while the shaded part of case lid 1502 is shown by a broken line. For the sake of simplicity, different states of the process are shown in the left half and the right half of the figure.

The state of the process after obtaining the construction of FIG. 15 is shown in the left half and the state after end of the final step, i.e. the completed state is in right half. Case lid 1.501 of this example has a shape that engages with case wall 1801. Wedge-form projection 1803 of the upper side tip of case wall 1801 is inserted in the part of groove 1602 on the circumference of case lid 1501. Epoxy resin 1805 is poured into this part so that case lid 1501 and case wall 1801 are caused to adhere. At the half right side of FIG. 18, silicone gel 1804 is filled in the module. A silicone resin is poured from injection hole 1503.

There is an air space 1806 between the upper surface of silicone gel 1804 and the underneath surface of the case lid member 1501. Injection hole 1503 is finally closed with a silicone rubber cap 1802. As silicone gel 1804 has a large coefficient of thermal expansion, a large pressure change in the module occurs in the manufacturing process and during use of the module. When an air space layer whose pressure change due to expansion and shrinkage is smaller than liquid, is formed in the module, the pressure change in the module could be small.

In case of heating the module to 150° C., for example, the pressure rise in the module is controlled to 0.5 atm. In this example, almost the whole surface of the silicone gel 1804 is at the air space layer so that the stress in the gel could be repressed to the utmost and the reliability of the module could be improved. FIG. 5 shows a part of a cross section of the semiconductor module which employed the case structure of this example. Solder, bonding wire and terminal feet, etc. are not shown in this figure, because they are not directly connected with the explanation. Resin lid 502 has a role to fix the terminal feet. Resin lid 502 is fixed to a metal plate 212 at the time of soldering the terminal feet. Then, resin wall 504 is fixed to metal plate 212, epoxy resin 425 was injected into the part where the resin lid 502 and resin wall .504 are engaged with each other and thereafter the resin was hardened.

A silicone resin was injected through the hole of the resin lid 502, and was hardened to obtain silicone gel 424. The injection quantity of silicone resin was adjusted to leave the air layer 501 at the upper part thereof. Finally, silicone rubber cap 503 was press-fitted. Because the silicone gel has such a large coefficient of thermal expansion as several hundreds ppm per ° C., the reliability of the package depends on how to avoid a pressure-change in the package due to the expansion and shrinkage. The adhesion power between a case material and an epoxy resin declines in accordance with the gas present on the surface of the case material at the time of hardening of silicone resin; therefore, the reliability of the package is lowered. The case structure of this example solves both of these problems.

As to an expansion of a silicone gel, a sufficient buffer effect is gained by providing the air layer in the package. With regard to pollution in the case surface by gas generation at the time of hardening of the silicone resin, it is possible to avoid the pollution by hardening the epoxy resin before hardening of the silicone resin. As is apparent from the above description, this case structure has a space above the silicone gel, securing the adhesive property between the epoxy resin and the case, thus the package has a high reliability. As is shown in FIG. 5, in the case structure of this invention, air layer 501 exists on almost the whole surface of the silicone gel 424 in the module.

According to the calculation of stress, the volume of the air layer 501 on silicone gel 424 provides an influence on the stress relief due to expansion and shrinkage of the silicone gel 424. It was confirmed that the area of the air layer 501 on the surface of the silicone gel 424 influences more than the volume.

The expansion and shrinkage of the silicone gel of, which the surface is an air layer, is caused in mainly up and down directions. The up and down movements of the silicone gel filled in the module, which does not touch air layer 501 is restricted, and a large stress occurs on that part. Since gel 424 deforms in right and left, and up and down directions, little stress occurs, compared with a perfect sealing. Because the movement in right and left, and up and down directions is little, the area of air layer 501 directly influences the reliability, even if the volume of air layer 501 is the same. In this sense, almost the entire surface of silicone gel 424 is covered with the air layer 501, and stress relief efficiently takes place to provide a highly reliable package structure.

Another structural feature of this example is that the pitch of the holes 1402 for installation shown in FIG. 15 coincides with the installation pitch of the aluminum nitride substrate 106. Because the aluminum nitride substrate 106 is brittle, curvatures are formed at the four corners. A gap of 2 mm in this example was formed between a pair of aluminum nitride substrates 106, which are not bonded so as to avoid extrusion of solder at the time of soldering the aluminum nitride substrates 106, so as to secure the machining precision of jigs for soldering and so as to attain workability, etc.

In the part sandwiched between the two aluminum nitride substrates 106, a small clearance in up and down directions is formed. Hole 1402 for installing was formed at this part. Consequently, the dimension of the whole module could be repressed to a small value. As shown in FIG. 18, case wall 1801 is entered into the space between aluminum nitride substrates 106.

Figure 19:
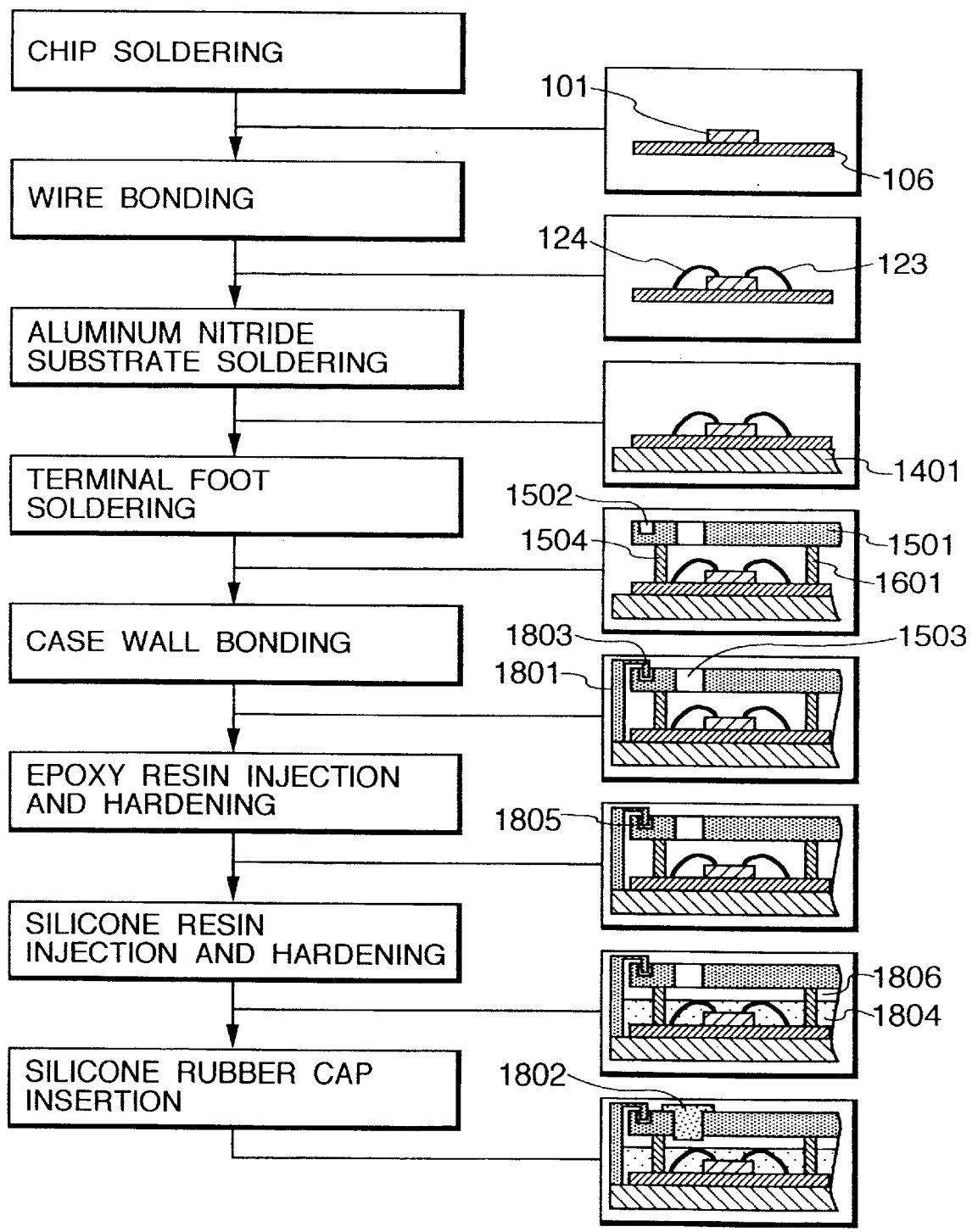
FIG. 19 shows a process diagram of the second example of this invention.

Now, the manufacturing process relating to this example will be explained by using FIG. 19. FIG. 19 shows a flow chart on the left side and cross-sectional views after each step on the right side.

(1) Soldering of Chips

This is the same as in the first example.

(2) Wire Bonding

This is the same as in the first example.

(3) Soldering of Aluminum Nitride Substrate

This is the same as in the first example except that the metal plate was changed from a molybdenum substrate 107 to copper molybdenum-copper cladding substrate 1401.

(4) Soldering of Terminal Feet

The terminal feet are fixed to case lid member 1501. Case lid 1501 has a groove 1502 on its periphery, and an injection hole 1503 is formed in the part near the center.

Bended part 1602 is formed at the tip of each of the terminal feet so as to relieve the stress due to any difference in coefficient of thermal expansion of the case material, copper-molybdenum-copper cladding substrate 1401 and aluminum nitride substrate 106. Solder grains of 40 weight % lead and tin balance solder were made into a paste with a soldering flux. The paste solder was put on the tips of all terminal feet, and then all terminal feet were collectively soldered. The atmosphere was air, and the maximum temperature for soldering was 220° C. After soldering, the residual flux was washed in the water.

(5) Bonding of Case Wall

Case wall 1801 was caused to adhere to copper-molybdenum copper cladding substrate 107 with a heat resistant adhesive at 150° C. in an air atmosphere. At this time, wedge-form projection 1803 at the tip of case wall 1801 engages groove 1502 on the periphery of the case lid member 1501.

(6) Pouring and Hardening of Epoxy Resin

Epoxy resin 1805 was poured into groove 1502 and was hardened at 150° C. in an air atmosphere. At this time, the case lid member 1501 and case wall 1801 were caused to adhere.

(7) Injection and Hardening of Silicone Resin

In the first example, a silicone resin and epoxy resin 1202 were injected from the space (about 20 mm wide) between case lid member 121 and case wall 1201. In this example, there is no gap between the case lid and the case wall unlike the first example, because wedge-form projection 1803 was inserted into groove 1502. Accordingly, injection hole 1503 was used for injection of silicone resin. The silicone resin was hardened at 150° C. in the air. Because a large quantity of gas is included in the silicone resin, de-bubbling was effected in a vacuum before hardening.

Gas generated from the silicone resin in de-bubbling and hardening may pollute the inside of case wall 1801. In the polluted part, adhesion between the epoxy resin 1805 and the case wall 1801 is deteriorated. In this example, the problem was avoided by effecting adhesion of the epoxy resin before hardening of the silicone resin. Silicone gel 1804 was injected to a level higher than the top part of the bonding wire. The part above the silicone gel 1804 was air layer 1806.

(8) Insertion of Silicone Rubber Cap

Finally, silicone rubber cap 1802 was press-fitted into injection hole 1503 at room temperature, and the injection hole 1503 was closed. Thus, the semiconductor module of this example was completed. Silicone rubber cap 1802 can withstand the pressure difference of 2 atm between the inside and outside of the module.

EXAMPLE 3

Figure 20A:
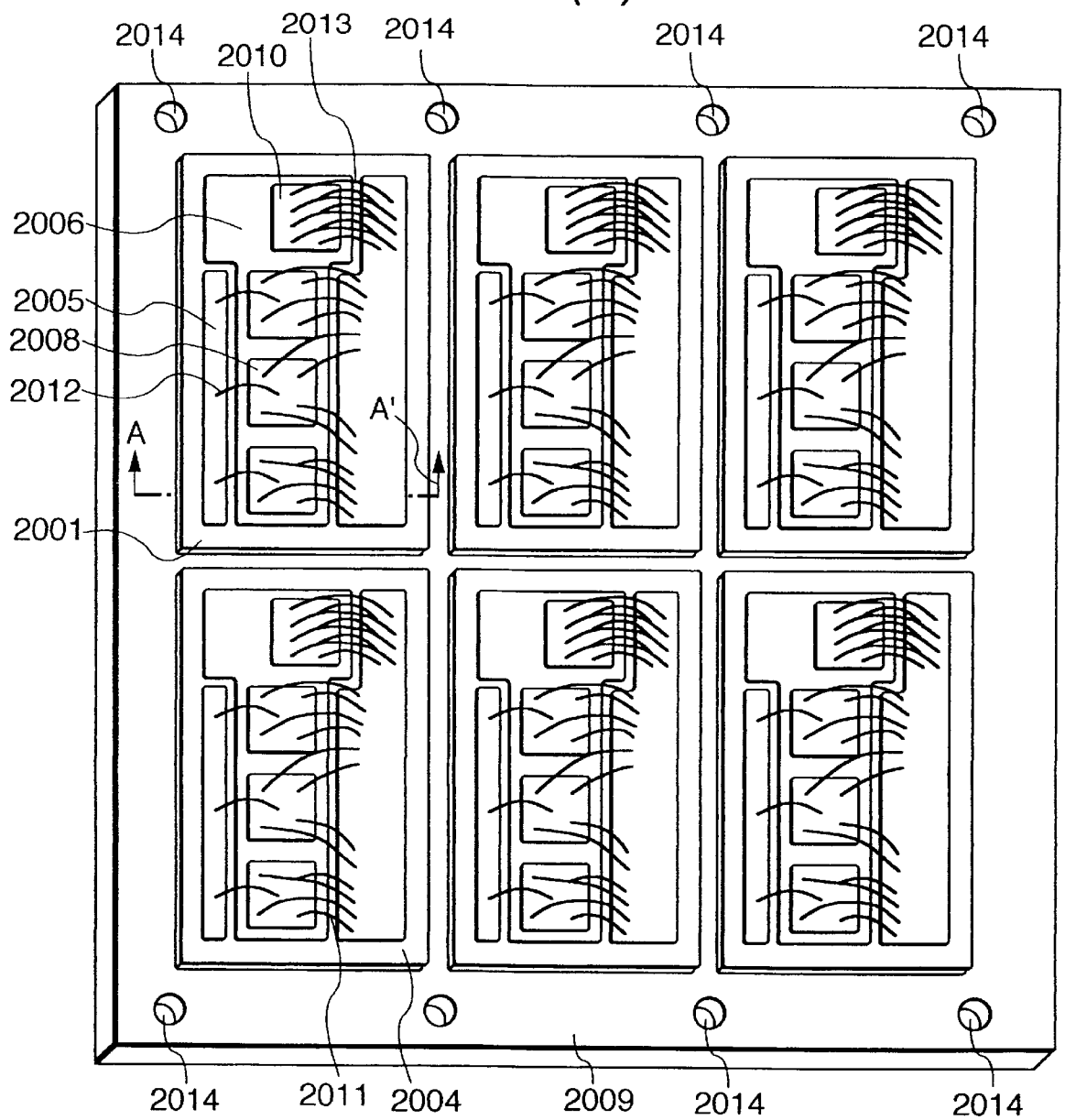
FIGS. 20a and 20b are a perspective view and a cross-sectional view of the third example of the present invention, respectively.
Figure 20B:
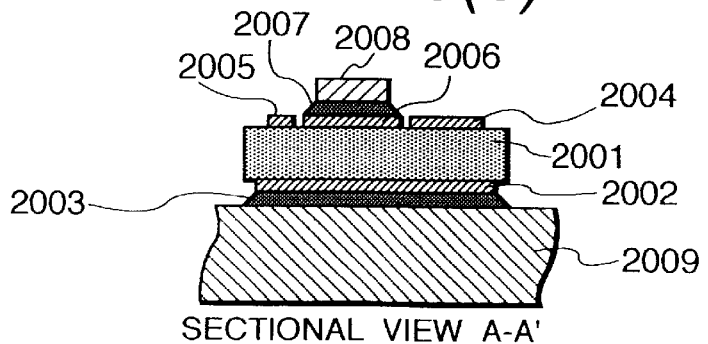
Figure 21:
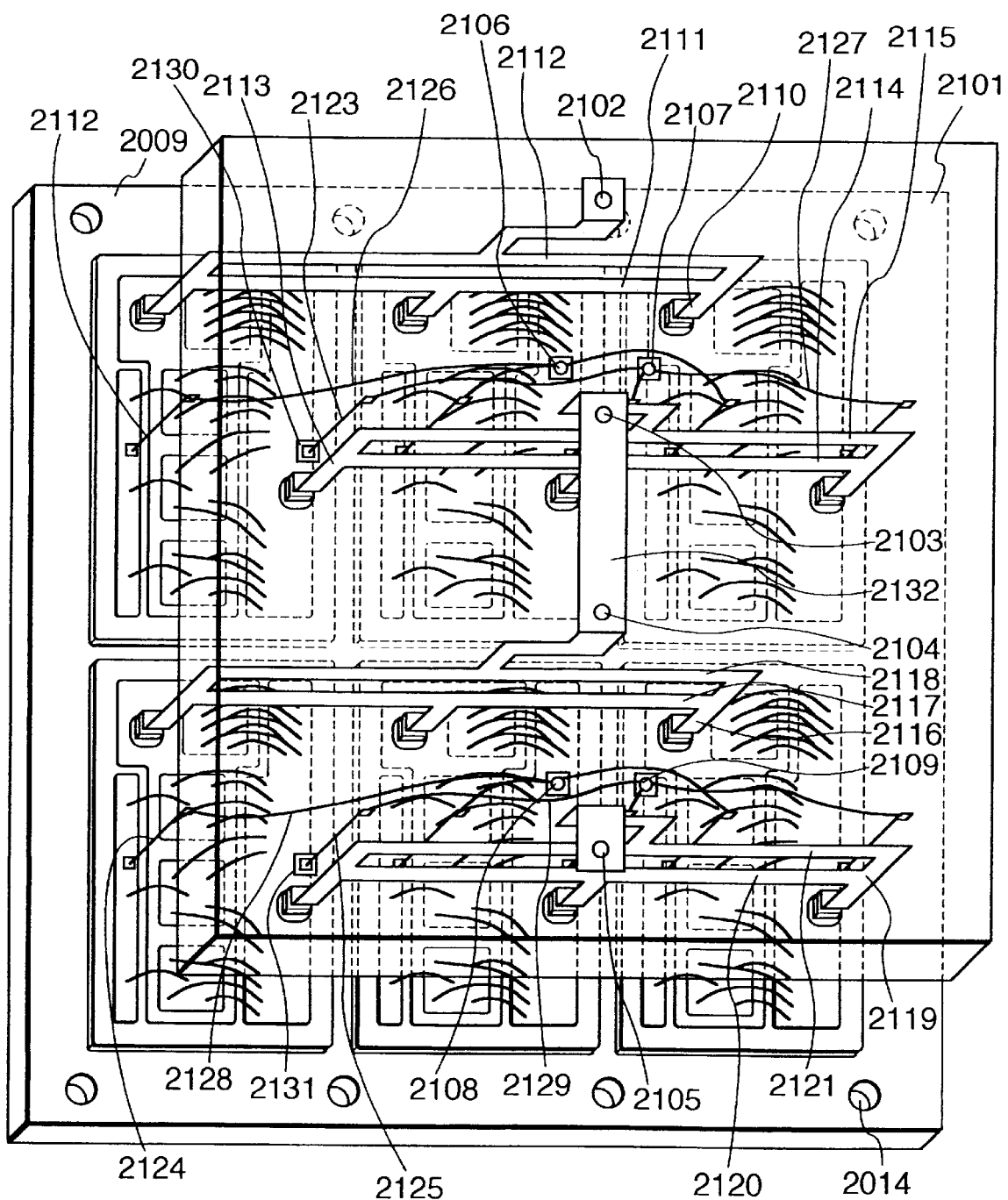
FIG. 21 is a partially transparent, perspective view showing the third example of the present invention.

The third example of the present invention will be explained by reference to FIG. 6, FIGS. 20a, 20b, FIG. 21 and FIG. 22. FIGS. 20a and 20b show a perspective view of a module and a cross section of the module resulting from the manufacturing process related to the third example of this invention, respectively. FIG. 21 like FIGS. 20a and 20b shows a perspective view of the module resulting from the manufacturing process wherein case lid member 2101 is shown as transparent for ease of explanation. As shown in FIGS. 20a and 20b, the module of this example is composed of six structural units. As shown in FIG. 21, three structural units are connected in parallel with each other to constitute two groups of units, and each of the unit groups is connected in series. Accordingly, the function of this module is the same as that which has two modules connected in series.

All structural units are mounted in the module in the same direction in this example. This example uses alumina substrate 2001. As shown in FIG. 20b, copper foil 2002 for bonding the metal plate was bonded directly to alumina substrate 2001 without brazing material. That is, the copper foil was bonded by copper oxide to the metal plate. Likewise, copper foil pattern 2004 for emitter wiring, copper foil pattern 2005 for gate wiring and copper foil pattern 2006 for collector wiring are bonded directly to the alumina substrate 2001.

Because alumina is richer in toughness than aluminum nitride, it is not necessary to form curvature at the end of the substrate, as in example 1 or 2. Likewise, there is no need for curvatures at the end of the pattern, either. This is a feature of the alumina substrate 2001. Copper-tungsten-copper cladding substrate 2009 was used in this example. This material has the following features in contrast with the copper-molybdenum-copper cladding substrate 1401 used in the second example.

(1) Good Thermal Conductivity in the Direction of the Plate Thickness (2) Small Coefficient of Thermal Expansion in the Direction Parallel to the Plate These features are due to the properties of tungsten. Molybdenum has a thermal conductivity as small as one third that of copper, but tungsten has a thermal conductivity as large as about half that of cooper.

The coefficient of thermal expansion of tungsten is smaller than that of molybdenum. Copper-tungsten-copper cladding substrate 2009 used in this example has an upper side copper and lower side copper layer each being 1 mm thick, and has a central tungsten layer which is 1 mm thick.

The coefficient of thermal expansion in the direction parallel to the plate is 9 ppm/° C., and the thermal conductivity in the direction of the plate thickness is 0.6 cal/cm.s.° C. Copper tungsten-copper cladding substrate 2009 does not impart thermal stress to solder 2003 for bonding the alumina substrate because the coefficient of thermal expansion of the laminate is approximately equal to that of alumina (7 ppm/° C.). Moreover, because the tungsten plate is sandwiched with the copper plates, there is no bimetal effect in the substrate. In addition, there is no bimetal effect between copper-tungsten-copper cladding substrate 2009 and alumina substrate 2001, because the coefficients of thermal expansion of the two are almost the same. Accordingly, little bending stress is imparted to the alumina substrate 2001. Then, the thermal stress imparted to solder 2007 under the chip becomes small, too. However, because the coefficient of thermal expansion of silicon is slightly different from that of alumina, a shearing stress occurs in solder 2007 beneath the chips between the two, due to the difference in the coefficient of thermal expansion.

The solder of this part is 5 wt % of Sb and Sn is the balance of the solder the same as in the first and second examples, thus the thermal fatigue resistance is high. Because this solder is hard, a shearing stress is imparted to solder 2003 through the alumina substrate 2001. Accordingly, the influence of a thermal stress which occurs at solder 2007 beneath the chips occurs on solder 2003 for bonding the alumina substrate just under the insulated gate transistor chip 2008 and the free wheel diode chip 2010.

When the tin-lead 40 weight % solder is used as solder 2003 for bonding the alumina substrate, having flexibility and excellent thermal stress resistance, the thermal stress can be absorbed by solder 2003. In this example, two kinds of solder, i.e. tin-antimony base solder and tin-lead base solder were used properly. Since the thermal conductivity in the thickness direction of the copper-tungsten-copper cladding substrate 2009 is larger than that of molybdenum by itself or the copper-molybdenum-copper cladding substrate, the heat resistance of the whole module can be repressed to as small as 0.01° C./W, which is the same degree as the other examples, even if the alumina substrate has a smaller thermal conductivity than the aluminum nitride substrate.

It is possible to use a tungsten-copper-tungsten cladding substrate instead of the copper-tungsten-copper cladding substrate used in this example; and the same effects would be obtained by using it. As shown in FIG. 21, the module of this example is composed of six structural units. Three structural units were connected in parallel and a pair of the combined units were connected in series in this example.

The case where three structural units are connected in parallel is the same as in the second example. Therefore, the explanation thereof is omitted. As for the external terminals, the upper side structural unit comprising collector terminal 2102, emitter terminal 2103, gate terminal 2106 and auxiliary emitter terminal 2107 is the same as the lower side structural unit comprising collector terminals 2104, emitter terminal 2105, gate terminal 2108 and auxiliary emitter terminal 2109. In this example, because the modules are connected in series by series connection bar 2132, when using it, an external main circuit of the module having two times the voltage resistance can be obtained.

Figure 6:
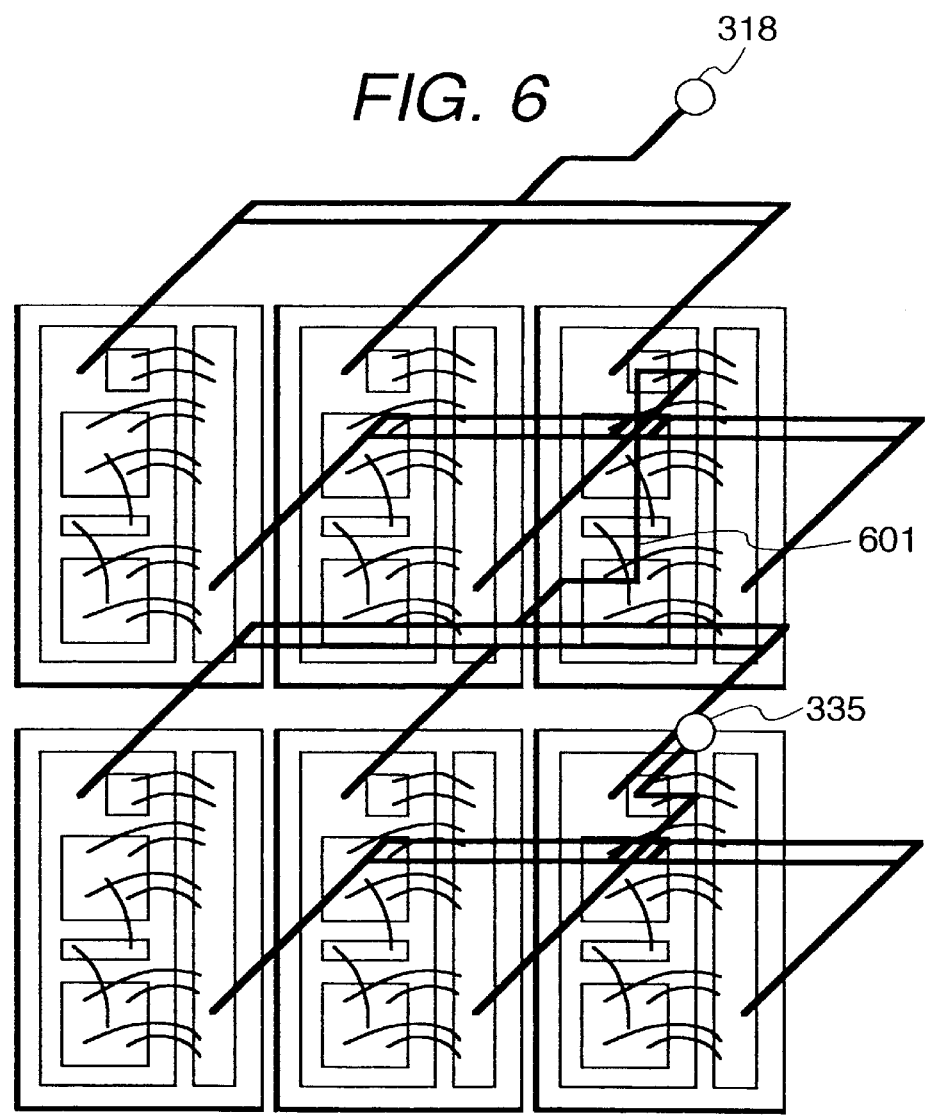
FIG. 6 shows a plane schematic diagram of a third example of this invention.

If the series connection bar 2132 is removable, it is apparent that the two modules can operate independently. The above is explained more in detail by way of FIG. 6. FIG. 6 shows that the two structural units shown in FIG. 3(*b*) are connected in series. By adding only terminal foot 601 for series connection to the arrangement of the structural unit shown in FIG. 3 (*b*), three parallel connections and two series connections can be done.

As is shown in FIG. 6, when the same are arranged in the same direction, any parallel or series connection of two or more structural units can be carried out smoothly. The feature of this example is that, as shown in FIG. 2, upper-side chip resistance 2130 is arranged below upper-side auxiliary emitter terminal foot 2123 and lower-side chip resistance 2131 is arranged below lower-side auxiliary emitter terminal foot 2125. Generally, the series resistance of a gate circuit is inserted between the gate wire 2012 of every chip and the copper foil pattern 2005 for gate wiring. To adjust scattering of the characteristics of each chip and to alleviate mismatching of inductance between each chip and the emitter wiring, insertion of the series resistance is effective.

In this example, the series resistance, i.e. the upper side chip resistance 2130 or lower side chip resistance 2131 is arranged between the upper side auxiliary emitter terminal foot 2123 or the lower side auxiliary emitter terminal foot 2125 and copper foil pattern 2004 for emitter wiring.

Figure 22:
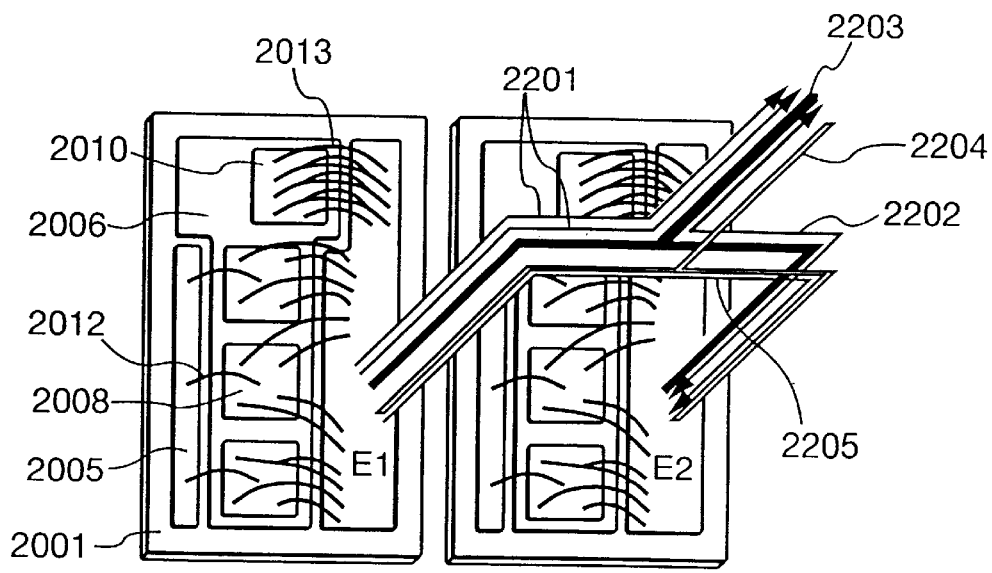
FIG. 22 is a perspective view for explanation of the effect of the third example of this invention

The advantage of this structure will be explained by referring to FIG. 22. In FIG. 22, two structural units are used for explanation. Supposing that the main current, just after starting of power flows, in the left side structural unit more than in the right side structural unit due to mismatching of inductance. In FIG. 22, the left side emitter main current 2201 is indicated by two arrows and the right side emitter main current 2202 is indicated by one arrow so that the number of arrows indicates the quantity of the main current. The heavy black line shows emitter main wiring 2203. Consequently, the electric potential (E1) of the copper foil pattern 2004 for the emitter wiring of the structural unit on the left side becomes higher than the electric potential (E2) of the copper foil pattern 2004 for the emitter wiring of the structural unit on the right side.

A hollow line indicated by the side of the emitter main wiring 2203, which is auxiliary emitter wiring 2204, is connected directly to copper foil pattern 2004 for the emitter wiring. Since E1 is greater than E2 (i.e. E1>E2), a part of the main current, that is, the main current 2205 in the auxiliary emitter wiring, flows in the auxiliary emitter wiring 2204 from the left side structural unit to the right side structural unit.

This electric current also has a possibility of burning off auxiliary emitter connecting line 2127 between the upper side structural units or auxiliary emitter connecting line 2129 between the under side structural units depending on the case. Even if such an extreme case does not happen, an unnecessary voltage drop may occur due to the main current 2205 in the auxiliary emitter wiring, and fluctuation of the voltage between gate emitters may occur. In order to control any harmful main current 2205 in the auxiliary emitter wiring and to protect the auxiliary emitter connecting wire 2127 for the upper side structural units and auxiliary emitter connecting wire 2129 for the under side structural units, the upper side chip resistance 2131 and the lower side chip resistance 2131 were arranged as mentioned above.

In the case where many modules are connected in series and in parallel, because the insulated gate transistor is of the voltage drive type, unlike switching elements of the electric current drive type, such as thyristors and transistors, it is relatively easy to supply a switching signal to each gate. That is, a large load is not imparted to the switching source. The wiring of the gate drive circuit may be made relatively rough.

When the impedance on the halfway is high, the noise from the main current mixes with the noise from the wiring for the gate drive to cause a malfunction. When the impedance of the gate circuit is lowered, in the driving gates, an unbalance of the characteristics of chips and a mismatching of the inductance of the emitter wires where the main current flows, affect directly the gate drive voltage to bring about scattering of the switching timings.

To compensate these conflicting characteristics simultaneously, a resistance is inserted into the gate circuit for every chip or every structural unit in general. When an unbalance occurs among the structural units, a difference in electric potential between the auxiliary emitters of the structural units may occur and there is a possibility that the main current will flow in the auxiliary emitter circuit. Then, a resistance is inserted into the auxiliary emitter circuit.

It is desirable for the chip resistance to be inserted between the tips of the terminal feet and the metallized pattern on the aluminum nitride or alumina substrate, and the chip resistance and terminal feet are soldered. When a general method in which a gate resistance is inserted separately into each chip of the insulated gate transistors is used in addition to the above, the stability effect is further increased. Further, it is effective to employ a method, in which the gate resistance for collecting is inserted into the outside of the module, in addition to the above

EXAMPLE 4

Figure 23:
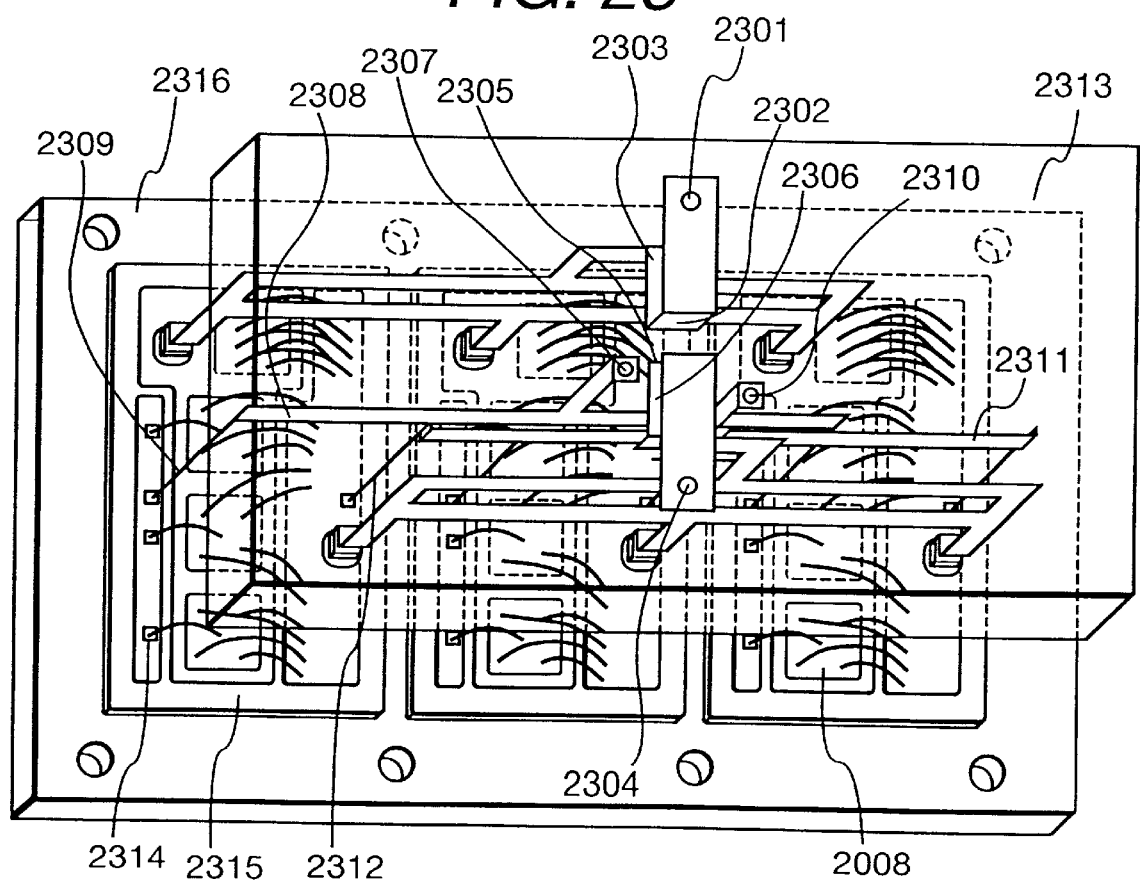
FIG. 23 is a partially transparent, perspective view showing the fourth example of the present invention.

FIG. 23 shows a fourth example of this invention. FIG. 20 shows an appearance of a module produced by the manufacturing process of the fourth example of this invention. Case lid member 2313 is shown as being transparent similar to the other examples. This example is different from the first through third examples in the following four points.

(1) Structure for Reducing the Inductance of the Main Terminal Small
(2) Resistance Inserted into Each of the Insulated Gate Transistor Chips
(3) Connections Between Gate Wiring and Auxiliary Emitter Wiring with Metal Plate, which are the Same as the Main Terminal
(4) Use of Alumina Substrate and Copper Substrate This example will be explained in the following. First, the structure of the main terminal will be explained. In examples 1, 2 and 3, while various modifications with regard to balancing of an inductance were employed from the viewpoint of the structure, a modification for reducing the absolute value of the inductance was employed in this example.

The basic structure of the main terminal is almost the same as the second example shown in FIG. 15. But, there is a part where the collector wiring and the emitter wiring come close to each other. That is, the emitter approaching part 2302 and the collector approaching part 2305 are close to each other.

Because the electric current flows in the parts 2302 and 2306 in opposite directions, the inductance by mutual induction becomes smaller when these parts come close. The inductances are cancelled by mutual induction utilizing the fact that current flows in opposite directions between a part that extends to the outside of the module at the side of the collector terminal 2301 and the collector parallel power part 2303 and between a part that extends to the outside of the module at the side of the collector terminal 2304 and the emitter parallel power part 2306. The distance between the emitter approaching part 2302 and the collector approaching part 2305 of this example is about 8 mm, thereby to bring about an effect that the inductance could be reduced by about 10 nH.

Next, the gate resistance will be explained. In this example, a chip resistance 2314 is inserted in every insulated gate transistor chip 2008. The advantage of this structure is that a deviation from ignition timing due to the scattering of characteristics among the chips can be suppressed to a minimum. Now, the gate wiring and the auxiliary emitter wiring among structural units will be explained. In this example, structural units are connected with the metal plates in the same manner as the main terminals.

The plates include a gate connecting plate 2308 and an auxiliary emitter connecting plate 2311 between structural units. The advantage of this structure is that it has fewer connecting parts than those of the examples already described. In the examples which have been described so far, because a lead wire coated with fluorine resin was used for wiring between structural units, soldering becomes unnecessary and the reliability of the module could be improved further. In addition, because soldering of the lead wire is not necessary, selection of the plating material for the surface of the gate terminal foot 2309 and the auxiliary emitter terminal foot 2312 can be made freely. In this example, all terminal feet can be plated with nickel, and soldering can be conducted smoothly. Now, a combination of the alumina substrate and copper substrate will be explained.

As a material that constitutes the base of the module, copper is suitable from the view point of thermal conductivity, rigidity and price. As the coefficient of thermal expansion of copper is large, a mismatching of the thermal expansion may occur between copper and silicon. To alleviate the mismatching of thermal expansion, an alumina layer having a coefficient in between those of silicon and copper was inserted between the silicon chip and the copper plate. The reason why alumina is selected instead of aluminum nitride is because the difference in the coefficients of thermal expansion between silicon and copper is large, and brittle aluminum nitride is unable to endure the thermal stress. Moreover, as the coefficient of thermal expansion of aluminum nitride is not in between, but closer to that of silicon, stress occurs in one spot of the bonding part of copper and aluminum nitride, and so the reliability of the whole module will decrease. Because the thermal stress that occurs between insulated gate transistor chip 2008 and alumina substrate 2315 is approximately equal to that of the third example, the thermal stress can be absorbed by a 5 weight % antimony and tin balance solder having a large thermal fatigue resistance.

A problem of reliability in this example may be raised by a mismatching of thermal expansion between the alumina substrate 2315 and the copper substrate 231G. A 40 weight % Pb and Sn balance solder was used in this part because the solder is high in flexibility and its thickness was kept to 200 $\mu$m, thereby good reliability could be secured.

The thickness of the solder of this part in Examples 1, 2 and 3 were about 100, $\mu$m. The bimetal action occurred as a result of inconsistency in thermal expansion between the alumina substrate 2315 and the copper substrate 231G. A bending stress was exerted on the 5 weight % Sb and Sn balance solder between the insulated gate transistor chip 2008 and the alumina substrate 2315.

As the thickness of the above solder was 200 $\mu$m or more, the influence of the bending stress could be suppressed minimum. Because the coefficient of thermal expansion of the copper substrate is close to that of the resin case (not illustrated) and lid member 2313, there is an advantage that any mismatching of the coefficients of thermal expansion is small over the whole module. In addition; the coefficient of thermal expansion of copper is larger than that of tungsten, molybdenum and combined materials of copper with those materials, but it is closer to that of the material (generally, aluminum is popular) of a heat sink (not illustrated). Accordingly, when mounting the module on a heat sink, the copper substrate has an advantage that heat conduction grease is hardly excluded by the action of any difference in thermal expansion.

EXAMPLE 5

The fifth example of this invention will be explained by reference to FIG. 24 to FIG. 27. FIG. 25 shows the appearance of a module produced by the manufacturing process related to the fifth example of this invention. The example of this invention has two structural units similar to the first example. But, unlike the first to fourth examples, each structural unit comprises two aluminum nitride substrates.

Each of the structural units is composed of a first aluminum nitride substrate 2406 mounting insulated gate transistor chip 2401 and a second aluminum nitride substrate 2409 mounting free wheel diode chip 2402. The appearance of each structural unit is illustrated by FIG. 24, which shows the appearance of the module in the manufacturing process before the step of FIG. 25.

Figure 24:
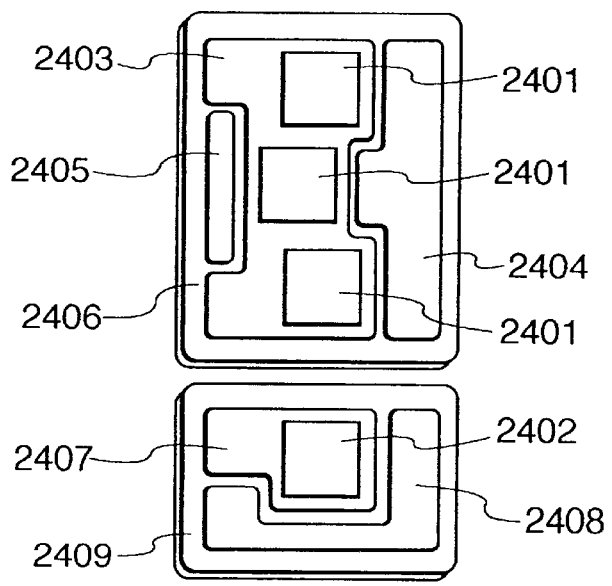
FIG. 24 is a perspective view showing the fifth example of the present invention.
Figure 25:
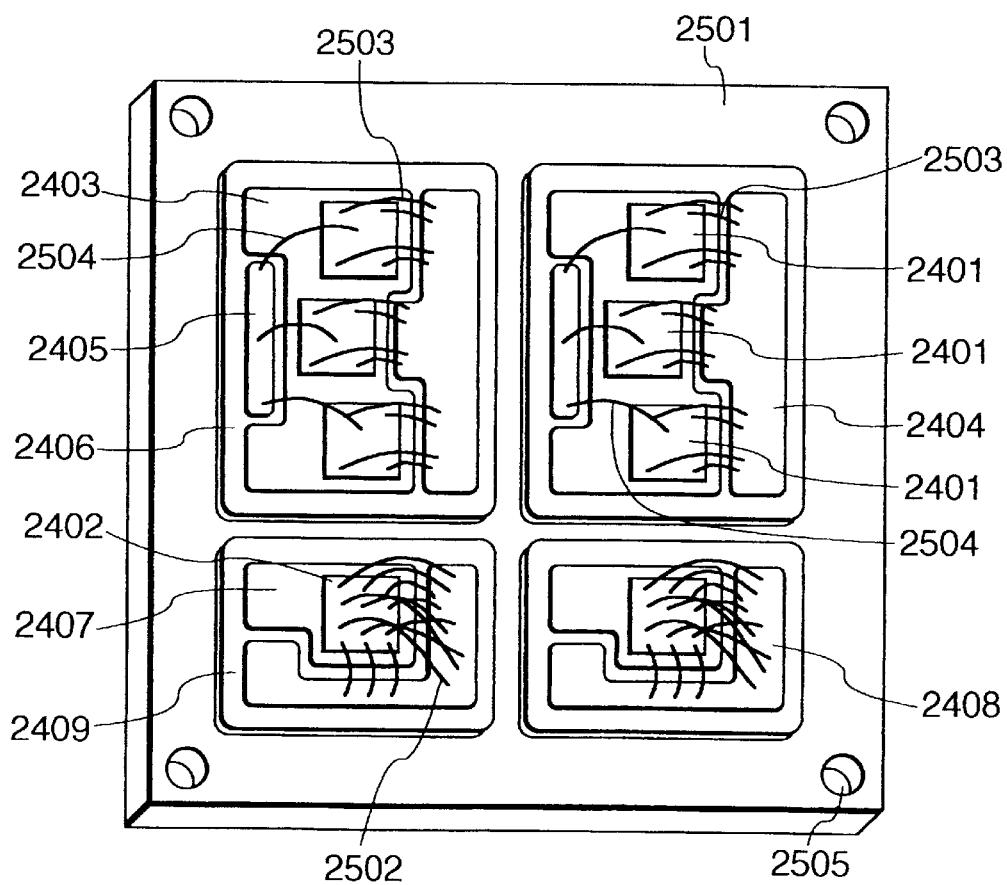
FIG. 25 is a perspective view showing the fifth example of the present invention.

Three insulated gate transistor chips 2401 are mounted on the first aluminum nitride substrate 2406 located on the upper part of FIG. 24. One free wheel diode chip 2402 was mounted on the second aluminum nitride substrate 2409 in the lower part. Insulated gate transistor chip 2401 and free wheel diode chip 2402 have the same external dimension of 10 mm square. Insulated gate transistor chips 2401 on the first aluminum nitride substrate 2406 are arranged so that a central chip is displaced to the left a little to form a dogleg.

Figure 26:
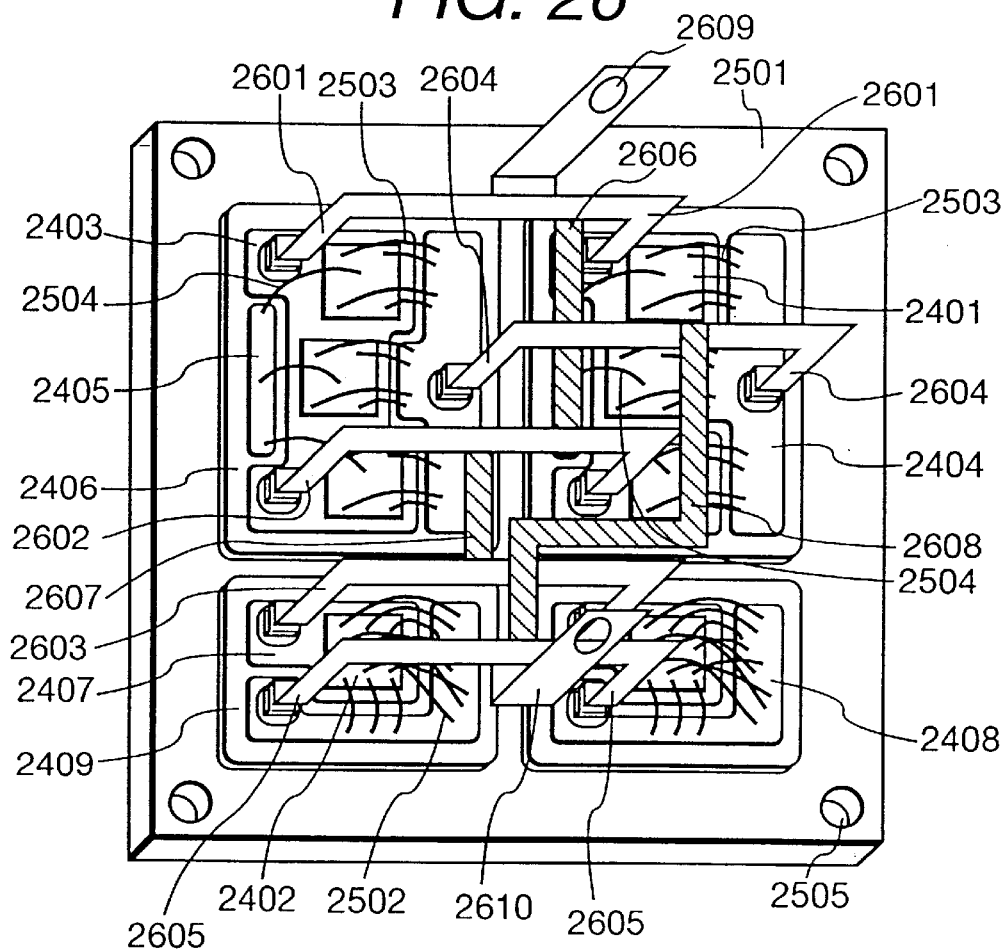
FIG. 26 is a perspective view showing the fifth example of the present invention.

According to this arrangement, the difference in the distance from the emitter terminal foot 2604 to each of the insulated gate transistor chips 2401 could be made small as shown in FIG. 26, and the inductance could be adjusted. In FIG. 26, a connection structure for the auxiliary terminal gate and auxiliary emitter terminal has been omitted for simplification. In addition, according to the dog-leg arrangement, areas for soldering the emitter terminal feet 2604, 2601 to the lower collector terminal foot 2602 beneath the collector terminal foot could be secured.

The reason why the collector terminal feet were divided into upper collector terminal feet 2601 and lower collector terminal feet 2602 is to adjust the inductance of the collector wiring. Collector linkage bar 2606 is provided in order to link the two collector terminal feet. Slanting lines were marked on collector linkage bar 2606 for easy understanding. As a result of dividing the aluminum nitride substrate into two pieces, the number of terminal feet is increased.

The number of the terminal feet are five for each structural unit. Interconnection in the structural unit becomes necessary. In this example, collector-cathode linkage bar 2607 and emitter anode linkage bar 2608 correspond to collector linkage bar 2606. Slanting lines were marked in the drawing for easy understanding.

Emitter-anode linkage bar 2608 connects the emitter and anode at positions which are strictly the same distance from right and left emitter terminal feet 2604 and anode terminal foot 2605 so as to adjust the inductance. However, collector linkage bar 2606 and cathode-collector linkage bar 2607 are arranged so as not to interfere with the emitter circuit. Here, an advantage of dividing the aluminum nitride substrate into two is miniaturization of the aluminum nitride substrates.

In the first example, the long side dimension of the aluminum nitride substrate 106, i.e. longitudinal dimension in the arrangement of FIG. 8(a) is 58 mm. In this example, because the substrate is formed by two sheets, the size of each of the substrates becomes as small as 46 mm in the longitudinal dimension of the first aluminum nitride substrate 2406 and 28 mm in the longitudinal dimension of the second aluminum nitride substrate 2409, which are smaller than that of the first example. However, it is quite natural that the sum of both substrates is larger than the dimension of the single substrate in the first example. The width of each of the substrates is 42 mm, which is the same as the first example.

The maximum thermal stress can be regarded as being substantially proportional to the maximum dimension of the parts integrated by soldering. In this case, the diagonal dimension of the aluminum nitride substrate corresponds to the maximum dimension. The diagonal dimension of the larger first aluminum nitride substrate 2406 is 62.3 mm, and the maximum thermal stress is 0.87 times that of the first example.

The diagonal dimension of the smaller second aluminum nitride substrate 2409 is 50.5 mm, and the maximum thermal stress is 0.7 times that of the first example. Anyway, the maximum thermal stresses become smaller.

Figure 27:
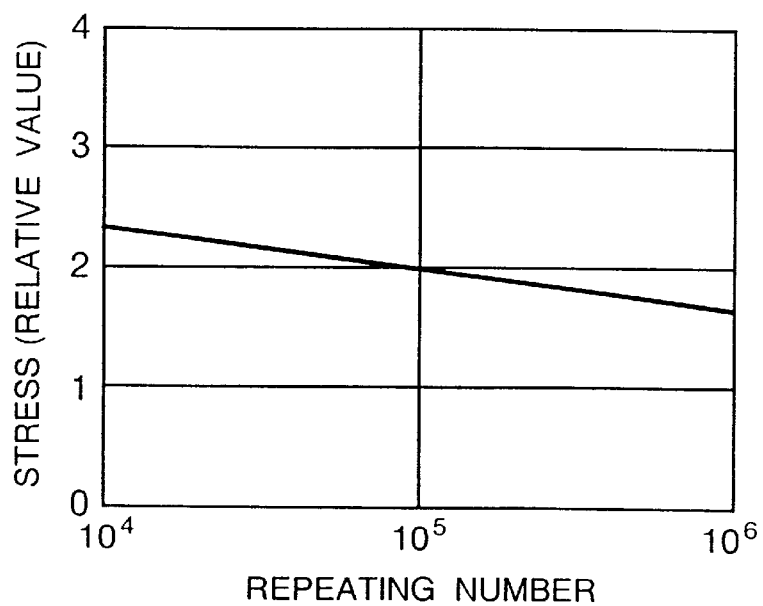
FIG. 27 is a graph explaining the effect of the fifth example of this invention.

Generally, there is a relationship between the repeated stress imparted to the metal plate and the repeating number until destruction of the metal plate occurs as shown in FIG. 27. The above relationship is the same as for the solder, though there is a little difference in the slope depending on the materials. It is easily understood from FIG. 27 that the thermal fatigue life greatly increases when the stress decreases by only about 10%. Accordingly, it is clear that the thermal fatigue resistance was improved in this example.

As the substrate dimension is reduced, the stress due to any difference in the thermal expansion of the aluminum nitride substrate and the copper foil pattern becomes small, and the thermal fatigue resistance of the aluminum nitride substrate is also improved.

(1) Wiring in the Structural Unit

Bonding of the collector of the insulated gate transistor and the cathode of the free wheel diode is done by soldering, and bonding of the anode of the emitter and gate of the insulated gate transistor and the anode of the free wheel diode is done by wire bonding using aluminum wire. Because the electric current capacity is large, the diameter of the aluminum wire is 0.3 mm or more.

In case a structural unit is composed of two aluminum nitride substrates, the wiring processes that connect the two substrates can be wire bonding using aluminum wire. Copper foil or copper foil with nickel plating can be soldered. Of course, the terminal foot of the copper, which is the means for connecting the external terminal can be used.

(2) Wiring Among Structural Units

The main means for realization of this wiring is soldering the terminal foot of the copper to the metallized pattern of the aluminum nitride surface. Another means is to employ the same structure as wiring between two wiring plates in the structural units. The structure employs wire bonding by aluminum wire or soldering of the cooper foil. However, the connecting positions of each structural unit and the connecting means must be made the same for each structural unit for the purpose of harmonizing the electric characteristics.

In case the structural unit is composed of one substrate, wiring in the structural unit is not included. Because aluminum nitride is brittle, the size of the substrate should be as small as possible. The diagonal length of the aluminum nitride plate is preferably 100 mm or less. When each structural unit is composed of many aluminum nitride substrates, wiring among substrates in the structural unit becomes complicated, and thus three or more substrates are not practical. Accordingly, the number of aluminum nitride substrates should be 1 or 2.

Alumina is stronger in its mechanical impact than aluminum nitride, thus the size of the substrate is not limited too much. There is no limitation to the substrate size and the number of the substrates in the structural unit.

EXAMPLE 6

Figure 28:
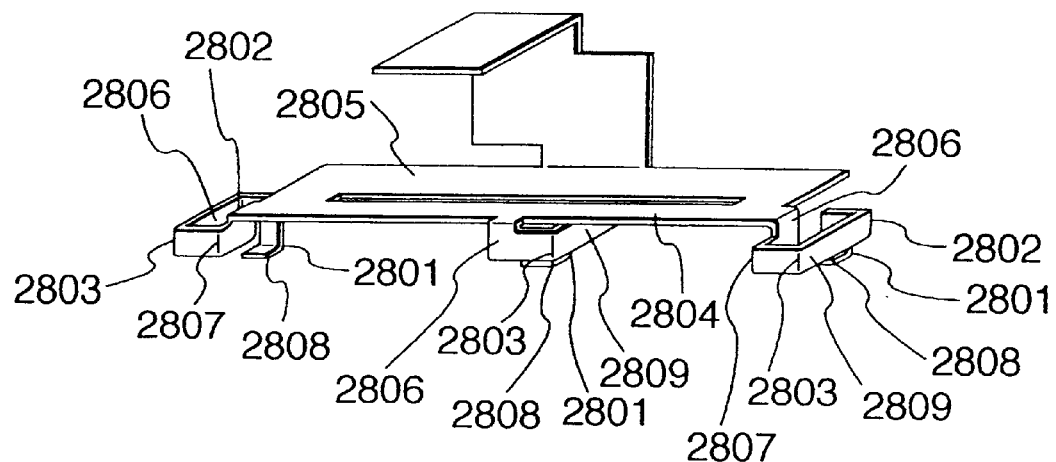
FIG. 28 is a perspective view showing the sixth example of the present invention.

The sixth example of this invention will be explained by reference to FIG. 28. FIG. 28 shows a case where the emitter terminal foot was taken out from the module. In the module of the sixth example, like the second example, the number of structural units is three, and the units are connected in parallel. Accordingly, there are three sets of tips 2806 of the emitter terminal feet, the sets being arranged with equal intervals. This example is featured by a bended part 280G at the tips of the terminal feet.

As shown in FIG. 28, there are at least three bended parts including first bended part 2801, second bended part 2802 and third bended part 2803, at the tips 2808 of the terminal feet. These bended parts protect the soldering part of the terminal foot tips 2808 from stress due to thermal expansion.

Since the first bended part 2801 has a bending axis in both left and right directions, as seen in the drawing, the bended part absorbs a deformation in a direction (front and the back direction), which is almost perpendicular to the face of the drawing.

Second bended part 2802, which has a bending axis in up and down directions, absorbs a deformation in the right and left directions, which are perpendicular to the bending directions. Deformation in the up and down directions is absorbed by the beam 2809 between the second bended part 2802 and the third bended part 2803. In this manner, the terminal feet are provided with at least three bended parts that can bend at a right angle, one of which has a bending axis in parallel with the surface of the substrate.

At least one of the remainder has a bending axis perpendicular to the surface of the substrate. Thus, terminal feet having three bending axes, each being flexible in a direction perpendicular to one another could be realized. That is, a flexible terminal foot was realized having three mutually perpendicular axial directions.

There is a fourth bended part 2807 at the tip of the terminal foot tip part 2806 on both ends. Due to this bended part, the flexibility increases further, but this bended part is not always essential. Because the copper terminal feet are fixed to a lid member made of resin, the terminal feet are subjected to a stress due to thermal expansion of the resin case. For the sake of reliability of the module, a material having a thermal expansion coefficient adjusted to that of metallic materials and a resin material whose coefficient of thermal expansion is made small are used. But, the coefficient of thermal expansion of the resin is quite large and the difference in thermal expansion coefficient is larger than that of many metals.

Aluminum nitride or alumina have coefficients quite smaller than those of metals such as copper, aluminum, iron, etc. Accordingly, a large thermal stress occurs in the horizontal direction of the soldering part of a terminal foot tip. In addition, because a lid member made of resin is bonded to the case made of a resin, the difference in thermal expansion of the resin (the case) and copper (terminal feet) is observed to occur in up and down directions. Accordingly, the thermal stress that occurs in the soldering part is exerted in a complicated three-dimensional manner, i. e. in right and left, and up and down directions.

In order to absorb this difference, it is possible to float copper foil from the aluminum nitride just under the soldering part or the surface of the alumina substrate. Because there is a case where the displacement or deformation quantity sometimes exceeds 10 μm, bended parts are provided on the terminal foot. Heat treatment is done in advance to soften the material of the terminal foot. In order to absorb a three-dimensional relative displacement, a three-dimensional bended part is provided on the tip of the terminal foot.

EXAMPLE 7

Figure 29:
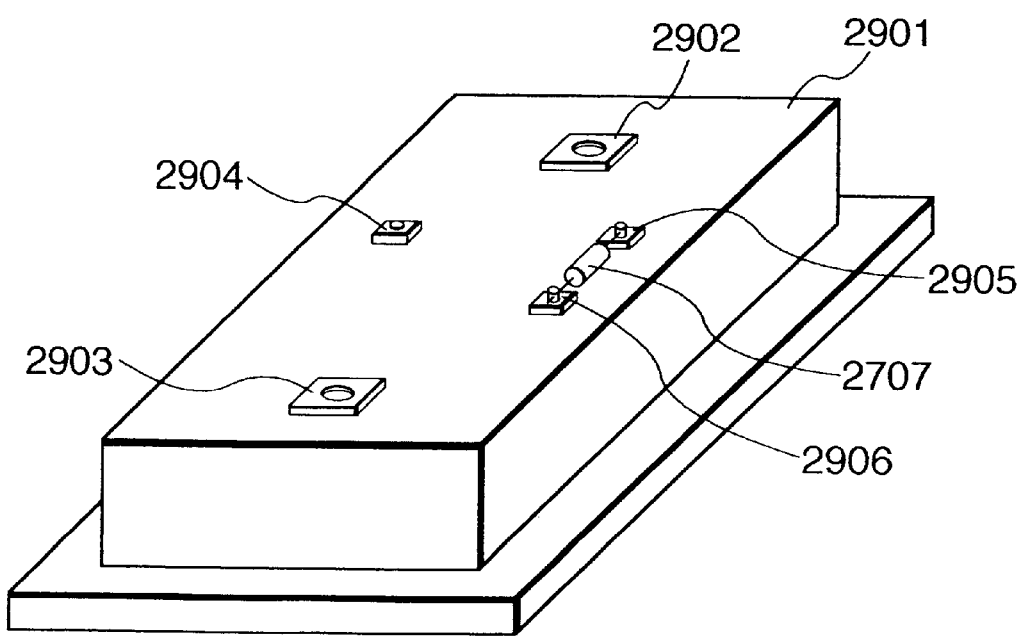
FIG. 29 is a perspective view showing the seventh example of the present invention.

The seventh example of this invention will be explained by FIG. 29. FIG. 29 shows an appearance of the module at the time of completion of the seventh example. Two main terminals are arranged on the surface of the module 2901. The upper part is a collector terminal 2902, and the lower part is an emitter terminal 2903. An auxiliary terminal, that is, auxiliary emitter terminal 2904, and gate terminal 2905 are arranged between the main terminals.

This terminal arrangement has an advantage in that, when a plurality of modules are arranged in series or parallel, the wiring for the gates is easy. In addition, this example has a feature that auxiliary gate terminal 2906 is formed on the surface of the module. This terminal is not electrically connected to the inside of the module.

As shown in the figure, the terminal is for installing external resistance 2907 in the wiring to the gate. The purpose of disposing the external resistance is for impedance adjustment of the gate wiring. A low impedance wiring is employed in the place near each module so as to avoid electric disturbance. However, when a low impedance wiring to the module is employed, it is impossible to adjust the difference in sensing among the modules. Then, to the adjust impedance, external attachment resistance 2907 is inserted.

0.5 Ohms were adopted as a resistance value in this example. In the module, as was explained in the fourth example, to adjust the scattering of the sensitivity of every chip, a gate resistance is inserted in every chip (not illustrated). The resistance value of the resistance inserted in the module is 6 ohms per 1 transistor chip of an insulation gate type.

As already explained, the external resistance 2907 installed in every module absorbs the scattering of performance among the modules, and operates to control the displacement of the switching time for each module. The arrangement of the auxiliary gate terminal 2906 of this example has an advantage in that mounting of the gate resistance to every module is facilitated. The main terminals are external terminals through which the main electric current flows. The auxiliary terminals are external terminals, i. e. auxiliary emitter terminals and gate terminals. The terminals are wired to emitters so as to prevent influence of the voltage drop (fluctuation) by the main electric current for a gate drive. In order to connect the modules in series and/or parallel, as was already described, it is necessary that all the external terminals are arranged atop of the modules, i.e. on the opposite surface from the metal plate. The holding of the auxiliary terminal between the main terminals may be effective.

When the scattering of switching timing is reduced by inserting a series resistance into the gate, the series resistance may be disposed not only in the module, but also outside of the module. Thus, operation of the module may be further stabilized. All auxiliary gate terminal was provided in the module. It is a solution for a stabilization of switching.

What is claimed is:

1. A semiconductor module comprising:

a metal substrate;

a plurality of insulating substrates mounted on said metal substrate;

power semiconductor devices, wherein an equal plural number of power semiconductor devices are mounted on each of said insulating substrates; and metal conductors for wiring, wherein an equal plural number of metal conductors are mounted on each of said insulating substrates, wherein said insulating substrates are arranged in substantially a same direction forming a row of insulating substrates on said metal substrate, wherein said metal conductors are electrically connected with electrode terminal feet, said electrode terminal feet being electrically connected with a linkage terminal foot and being disposed with a certain interval therebetween, respectively, wherein said power semiconductor devices and said metal conductors are disposed in a substantially same and asymmetrical arrangement, with respect to a plan view layout, on each of said insulating substrates, respectively, and wherein the interval between the electrode terminal feet of adjacent insulating substrates in said row of insulating substrates is substantially equal to the interval between corresponding semiconductor devices, which are similarly positioned, on each of the adjacent insulating substrates, respectively.

2. The semiconductor module according to claim 1, wherein said power semiconductor devices are asymmetrically arranged, with respect to a plan view of each of said insulating substrates, in both left-right and up-down directions from centrally located vertical and horizontal axes of each insulating substrate, respectively.

3. The semiconductor module according to claim 1, wherein said linkage terminal foot electrically connects corresponding ones of said electrode terminal feet which are electrically connected to corresponding metal conductors on at least two different ones of said insulating substrates.

4. The semiconductor module according to claim 1, wherein the number of said insulating substrates is at least three, and wherein said linkage terminal foot electrically connects corresponding ones of said electrode terminal feet which are electrically connected to corresponding metal conductors on at least three different ones of said insulating substrates.

5. The semiconductor module according to claim 1, wherein the number of said insulating substrates is at least three.

6. The semiconductor module according to claim 1, further comprising terminals disposed atop of said semiconductor devices.

7. The semiconductor module according to claim 5, wherein said terminals comprise main terminals through which the main current of said semiconductor devices flows, control terminals for controlling said power semiconductor devices, and an auxiliary terminal, said control terminal and said auxiliary terminal being disposed between said main terminals.

8. The semiconductor module according to claim 1, wherein said linkage terminal foot is provided with an inductance adjusting foot.

9. The semiconductor module according to claim 1, wherein said electrode terminal feet on said metal conductor are each provided with a bended part.

10. The semiconductor module according to claim 1, wherein said insulating substrates are made of one of aluminum nitride and alumina.

11. The semiconductor module according to claim 10, wherein said metal conductors are formed of copper foil, respectively, and are fixed to each of said insulating substrates with a silver solder, and said power semiconductor devices are bonded with a tin-antimony series solder on said copper foil.

12. The semiconductor module according to claim 11, wherein said tin-antimony series solder contains 4% to 6% by weight of antimony.

13. The semiconductor module according to claim 10, further comprising a metallic plate disposed on each of said insulating substrates, said metallic plate being provided with a copper foil plated with nickel, wherein said insulating substrates are bonded to said copper foil with silver solder.

14. The semiconductor module according to claim 13, further comprising a resin wall surrounding said insulating substrates, and a resin lid for engaging said resin wall above said metal plate, wherein a hollow formed by said metal plate, said resin wall and said resin lid has a silicone layer and an air layer therein.

15. The semiconductor module according to claim 14, wherein the engaging part of said resin wall and said resin lid has a gap, which is filled with epoxy resin.

16. The semiconductor module according to claim 1, wherein said power semiconductor devices are asymmetrically arranged, with respect to a plan view of each of said insulating substrates, in right and left direction from a centrally located vertical axis of each insulating substrate.

17. The semiconductor module according to claim 1, wherein said power semiconductor devices are asymmetrically arranged, with respect to a plan view of each of said insulating substrates, in up and down directions from a centrally located horizontal axis of each insulating substrate.

18. A semiconductor module comprising:

a metal substrate;

a plurality of insulating substrates mounted on said metal substrates;

power semiconductor devices, wherein an equal plural number of power semiconductor devices are mounted on each of said insulating substrates; and metal conductors for wiring, wherein an equal plural number of metal conductors are mounted on each of said insulating substrates;

wherein said insulating substrates are arranged in substantially a same direction on said metal substrate, respectively, to be substantially parallel to one another, wherein said metal conductors are electrically connected with electrode terminal feet, said electrode terminal feet being electrically connected with a linkage terminal foot and being disposed with a certain interval therebetween, respectively, to substantially equalize inductance between circuits mounted on different ones of said parallel insulating substrates to prevent uneven electric current concentration between individual ones of said circuits, wherein said power semiconductor devices and said metal conductors are disposed in a substantially same and asymmetrical arrangement, with respect to a plan view layout, on each of said insulating substrates, respectively, and wherein the interval between the electrode terminal feet of adjacent ones of said parallel arranged insulating substrates is substantially equal to the interval between corresponding semiconductor devices, which are similarly positioned, on adjacent insulating substrates, respectively.

19. The semiconductor module according to claim 18, wherein the number of said insulating substrates is at least three, and wherein said linkage terminal foot electrically connects corresponding ones of said electrode terminal feet which are electrically connected to corresponding metal conductors on at least three different ones of said insulating substrates.

20. A semiconductor module according to claim 18, wherein at least three of said insulating substrates are provided, and the intervals between corresponding ones of the electrode terminal feet of each of said insulating substrates are substantially the same.

21. The semiconductor module according to claim 18, wherein said semiconductor devices are asymmetrically arranged, with respect to a plan view of each of said insulating substrates, in both left-right and up-down directions from centrally located vertical and horizontal axes of each insulating substrate, respectively.

22. The semiconductor module according to claim 18, further comprising terminals disposed atop of said semiconductor devices.

23. The semiconductor module according to claim 22, wherein said terminals comprise main terminals through which the main current of said semiconductor devices flows, control terminals for controlling said power semiconductor devices, and an auxiliary terminal, said control terminal and said auxiliary terminal being disposed between said main terminals.

24. The semiconductor module according to claim 18, wherein said electrode terminal feet on said metal conductors are each provided with a bended part.

25. The semiconductor module according to claim 18, wherein said linkage terminal foot is provided with an inductance adjusting foot.

26. The semiconductor module according to claim 18, wherein said insulating substrates are made of one of aluminum nitride and alumina.

27. The semiconductor module according to claim 26, wherein each of said insulating substrates are provided with a copper foil fixed to said each of said insulating substrates with a silver solder, and said power semiconductor devices are bonded with a tin-antimony series solder on said copper foil.

28. The semiconductor module according to claim 27, wherein said tin-antimony series solder contains 4% to 6% by weight of antimony.

29. The semiconductor module according to claim 26, which further comprises a metallic plate disposed on each of said insulating substrates, said metallic plate being provided with a copper foil plated with nickel, wherein said insulating substrates are bonded to said copper foil with silver solder.

30. The semiconductor module according to claim 29, which further comprises a resin wall surrounding said insulating substrates, and a resin lid for engaging said resin wall above said metal plate, wherein a hollow formed by said metal plate, said resin wall and said resin lid has a silicone layer and an air layer therein.

31. The semiconductor module according to claim 30, wherein the engaging part of said resin wall and said resin lid has a gap, which is filled with epoxy resin.

32. A semiconductor module comprising:

a metal substrate;

a plurality of insulating substrates mounted on said metal substrate;

power semiconductor devices, wherein an equal plural number of power semiconductor devices are mounted on each of said insulating substrates;

metal conductors for wiring, wherein an equal plural number of metal conductors are mounted on each of said insulating substrates; and means to substantially equalize inductances between circuits which are mounted on said insulating substrates to prevent uneven electric current concentration in individual ones of said circuits, said means comprising an arrangement of said insulating substrates in substantially the same direction on said metal substrate, respectively, to be substantially parallel to one another, wherein said metal conductors are electrically connected with electrode terminal feet, said electrode terminal feet being electrically connected with a linkage terminal foot and being disposed with a certain interval therebetween, respectively, wherein said power semiconductor devices and said metal conductors are arranged in a substantially same and asymmetrical arrangement, with respect to a plan view layout, on each of said insulating substrates, respectively, and wherein the interval between the electrode terminal feet of adjacent ones of said parallel arranged insulating substrates is substantially equal to the interval between corresponding semiconductor devices, which are similarly positioned, on adjacent insulating substrates, respectively.

33. A semiconductor module according to claim 32, wherein at least three of said insulating substrates are provided, and wherein said means further comprises setting the intervals between corresponding ones of the electrode terminal feet of each of said insulating substrates to be substantially the same.

34. The semiconductor module according to claim 32, wherein said semiconductor devices are asymmetrically arranged, with respect to a plan view of each of said insulating substrates, in both left-right and up-down directions from centrally located vertical and horizontal axes of each insulating substrate, respectively.

35. The semiconductor module according to claim 32, which further comprises terminals disposed atop of said semiconductor devices.

36. The semiconductor module according to claim 35, wherein said terminals comprise main terminals through which the main current of said semiconductor devices flows, control terminals for controlling said power semiconductor devices, and an auxiliary terminal, said control terminal and said auxiliary terminal being disposed between said main terminals.

37. The semiconductor module according to claim 32, wherein said electrode terminal feet on said metal conductors are each provided with a bended part.

38. The semiconductor module according to claim 32 wherein said linkage terminal foot is provided with an inductance adjusting foot.

39. The semiconductor module according to claim 32, wherein said insulating substrates are made of one of aluminum nitride and alumina.

40. The semiconductor module according to claim 39, wherein each of said insulating substrates are provided with a copper foil fixed to said each of said insulating substrates with a silver solder, and said power semiconductor devices are bonded with a tin-antimony series solder on said copper foil.

41. The semiconductor module according to claim 40, wherein said tin-antimony series solder contains 4% to 6% by weight of antimony.

42. The semiconductor module according to claim 39, which further comprises a metallic plate disposed on each of said insulating substrates, said metallic plate being provided with a copper foil plated with nickel, wherein said insulating substrates are bonded to said copper foil with silver solder.

43. The semiconductor module according to claim 42, which further comprises a resin wall surrounding said insulating substrates, and a resin lid for engaging said resin wall above said metal plate, wherein a hollow formed by said metal plate, said resin wall and said resin lid has a silicone layer and an air layer therein.

44. The semiconductor module according to claim 43, wherein the engaging part of said resin wall and said resin lid has a gap, which is filled with epoxy resin.

* * * * *